(12) United States Patent
Guo et al.

(10) Patent No.: US 12,254,838 B2
(45) Date of Patent: Mar. 18, 2025

(54) SHIFT REGISTER UNIT, GATE DRIVER CIRCUIT, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yonglin Guo, Beijing (CN); Zhiliang Jiang, Beijing (CN); Ming Hu, Beijing (CN); Ziyang Yu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/281,569

(22) PCT Filed: Oct. 28, 2022

(86) PCT No.: PCT/CN2022/128105
§ 371 (c)(1),
(2) Date: Sep. 12, 2023

(87) PCT Pub. No.: WO2024/087130
PCT Pub. Date: May 2, 2024

(65) Prior Publication Data
US 2025/0029563 A1 Jan. 23, 2025

(51) Int. Cl.
*G09G 3/32* (2016.01)
*G09G 3/3266* (2016.01)
*G11C 19/28* (2006.01)

(52) U.S. Cl.
CPC ........ *G09G 3/3266* (2013.01); *G11C 19/287* (2013.01); *G09G 2310/0286* (2013.01); *G09G 2320/02* (2013.01)

(58) Field of Classification Search
CPC .......... G09G 3/3266; G09G 3/32; G09G 3/30; G09G 2310/0286; G09G 2310/02; G09G 2320/02; G11C 19/287
See application file for complete search history.

(56) References Cited

U.S. PATENT DOCUMENTS

2010/0166136 A1   7/2010  Tobita
2017/0365211 A1  12/2017  Lee et al.
(Continued)

FOREIGN PATENT DOCUMENTS

CN   107527589 A   12/2017
CN   112687230 A   4/2021
(Continued)

*Primary Examiner* — Pegeman Karimi
(74) *Attorney, Agent, or Firm* — XSENSUS LLP

(57) ABSTRACT

Provided is a shift register unit. The shift register unit includes: a first input circuit, coupled to a first clock terminal, an input terminal, a first node and a second node; a second input circuit, coupled to the first node, the first clock terminal, a first power terminal and a third node; a first control circuit, coupled to the input terminal, the first clock terminal, the second node, a second power terminal, a second clock terminal and the third node; a second control circuit, coupled to the third node, the second clock terminal, the first node, the first power terminal, the second power terminal, a fourth node and a fifth node; and an output circuit, coupled to the fourth node, the fifth node, the first power terminal, the second power terminal and an output terminal.

20 Claims, 10 Drawing Sheets

(56) References Cited

U.S. PATENT DOCUMENTS

| | | | |
|---|---|---|---|
| 2019/0139475 A1* | 5/2019 | Wang | G11C 7/02 |
| 2019/0295489 A1* | 9/2019 | Wang | G11C 8/04 |
| 2020/0152127 A1 | 5/2020 | Kang et al. | |
| 2021/0056880 A1* | 2/2021 | Mou | G11C 19/28 |
| 2021/0118347 A1* | 4/2021 | Wang | G09G 3/3266 |
| 2021/0335178 A1* | 10/2021 | Hu | G11C 19/28 |
| 2021/0366402 A1 | 11/2021 | In et al. | |
| 2023/0252933 A1 | 8/2023 | Guo et al. | |
| 2023/0335030 A1 | 10/2023 | Guo et al. | |

FOREIGN PATENT DOCUMENTS

| | | |
|---|---|---|
| CN | 112802422 A | 5/2021 |
| CN | 113178221 A | 7/2021 |
| CN | 113421518 A | 9/2021 |
| CN | 113421528 A | 9/2021 |
| CN | 113707097 A | 11/2021 |

* cited by examiner

SHIFT REGISTER UNIT, GATE DRIVER CIRCUIT, AND DISPLAY DEVICE

CROSS-REFERENCE TO RELATED APPLICATION

This application is a U.S. national stage of international application No. PCT/CN2022/128105, filed on Oct. 28, 2022, the disclosure of which is incorporated herein by reference in its entirety.

TECHNICAL FIELD

The present disclosure relates to the field of display technologies, and in particular, to a shift register unit, a gate driver circuit, and a display device.

BACKGROUND

Active-matrix organic light-emitting diode (AMOLED) display devices are widely used in various products for their advantages of bendability, high contrast, low power consumption and the like.

SUMMARY

Embodiments of the present disclosure provide a shift register unit, a gate driver circuit, and a display device. The technical solutions are as follows.

In some embodiments of the present disclosure, a shift register unit is provided. The shift register unit includes:
  a first input circuit, coupled to a first clock terminal, an input terminal, a first node and a second node, and configured to control connection or disconnection between the input terminal and the first node in response to a first clock signal provided by the first clock terminal, and control connection or disconnection between the second node and the first node in response to a potential at the second node;
  a second input circuit, coupled to the first node, the first clock terminal, a first power terminal and a third node, and configured to control connection or disconnection between the first clock terminal and the third node in response to a potential at the first node, and control connection or disconnection between the first power terminal and the third node in response to the first clock signal;
  a first control circuit, coupled to the input terminal, the first clock terminal, the second node, a second power terminal, a second clock terminal and the third node, and configured to control connection or disconnection between the input terminal and the second node in response to the first clock signal, control connection or disconnection between the second power terminal and the second node in response to a potential at the third node, and control connection or disconnection between the second clock terminal and the second node in response to the potential at the second node;
  a second control circuit, coupled to the third node, the second clock terminal, the first node, the first power terminal, the second power terminal, a fourth node and a fifth node, and configured to control connection or disconnection between the second clock terminal and the fourth node in response to the potential at the third node and a second clock signal provided by the second clock terminal, control connection or disconnection between the second power terminal and the fourth node in response to the potential at the first node, and control the first node to be connected to the fifth node in response to a first power signal provided by the first power terminal; and
  an output circuit, coupled to the fourth node, the fifth node, the first power terminal, the second power terminal and an output terminal, and configured to control connection or disconnection between the second power terminal and the output terminal in response to a potential at the fourth node, and control connection or disconnection between the first power terminal and the output terminal in response to a potential at the fifth node.

In some embodiments, the first input circuit includes: a first input sub-circuit and a second input sub-circuit; wherein
  the first input sub-circuit is coupled to the first clock terminal, the input terminal and the first node, and is configured to control the connection or disconnection between the input terminal and the first node in response to the first clock signal provided by the first clock terminal; and
  the second input sub-circuit is coupled to the second node and the first node, and is configured to control the connection or disconnection between the second node and the first node in response to the potential at the second node.

In some embodiments, the first input sub-circuit includes a first transistor; and the second input sub-circuit includes a second transistor; wherein
  a gate of the first transistor is coupled to the first clock terminal, a first electrode of the first transistor is coupled to the input terminal, and a second electrode of the first transistor is coupled to the first node; and
  a gate and a first electrode of the second transistor are both coupled to the second node, and a second electrode of the second transistor is coupled to the first node.

In some embodiments, the second input circuit includes: a third input sub-circuit and a fourth input sub-circuit; wherein
  the third input sub-circuit is coupled to the first node, the first clock terminal and the third node, and is configured to control the connection or disconnection between the first clock terminal and the third node in response to the potential at the first node; and
  the fourth input sub-circuit is coupled to the first clock terminal, the first power terminal and the third node, and is configured to control the connection or disconnection between the first power terminal and the third node in response to the first clock signal.

In some embodiments, the third input sub-circuit includes a third transistor; and the fourth input sub-circuit includes a fourth transistor; wherein
  a gate of the third transistor is coupled to the first node, a first electrode of the third transistor is coupled to the first clock terminal, and a second electrode of the third transistor is coupled to the third node; and
  a gate of the fourth transistor is coupled to the first clock terminal, a first electrode of the fourth transistor is coupled to the first power terminal, and a second electrode of the fourth transistor is coupled to the third node.

In some embodiments, the first control circuit includes:
  a first control sub-circuit, coupled to the first clock terminal, the input terminal and the second node, and configured to control the connection or disconnection between the input terminal and the second node in response to the first clock signal;

a second control sub-circuit, coupled to the second node, the second power terminal, the third node, the second clock terminal and a sixth node, and configured to control connection or disconnection between the second power terminal and the sixth node in response to the potential at the third node, and control connection or disconnection between the second clock terminal and the sixth node in response to the potential at the second node; and a potential adjustment sub-circuit, coupled to the second node and the sixth node, and configured to adjust the potential at the second node and a potential at the sixth node.

In some embodiments, the first control sub-circuit includes a fifth transistor; the second control sub-circuit includes a sixth transistor and a seventh transistor; and the potential adjustment sub-circuit includes a first capacitor; wherein a gate of the fifth transistor is coupled to the first clock terminal, a first electrode of the fifth transistor is coupled to the input terminal, and a second electrode of the fifth transistor is coupled to the second node;

a gate of the sixth transistor is coupled to the third node, a first electrode of the sixth transistor is coupled to the second power terminal, and a second electrode of the sixth transistor is coupled to the sixth node;

a gate of the seventh transistor is coupled to the second node, a first electrode of the seventh transistor is coupled to the second clock terminal, and a second electrode of the seventh transistor is coupled to the sixth node; and a first terminal of the first capacitor is coupled to the second node, and a second terminal of the first capacitor is coupled to the sixth node.

In some embodiments, the shift register unit further includes:

a third control circuit, coupled to the first power terminal, a seventh node and the second node, and configured to control the seventh node to be connected to the second node in response to the first power signal;

wherein the seventh node is coupled to the first control sub-circuit.

In some embodiments, the third control circuit includes an eighth transistor; wherein a gate of the eighth transistor is coupled to the first power terminal, a first electrode of the eighth transistor is coupled to the seventh node, and a second electrode of the eighth transistor is coupled to the second node.

In some embodiments, the second control circuit includes:

a third control sub-circuit, coupled to the third node, the second clock terminal, the second power terminal, the first node and the fourth node, and configured to control the connection or disconnection between the second clock terminal and the fourth node in response to the potential at the third node and the second clock signal, and control the connection or disconnection between the second power terminal and the fourth node in response to the potential at the first node; and a fourth control sub-circuit, coupled to the first power terminal, the first node and the fifth node, and configured to control the first node to be connected to the fifth node in response to the first power signal.

In some embodiments, the third control sub-circuit includes a ninth transistor, a tenth transistor, an eleventh transistor and a second capacitor; and the fourth control sub-circuit includes a twelfth transistor; wherein a gate of the ninth transistor is coupled to the third node, a first electrode of the ninth transistor and a gate of the tenth transistor are both coupled to the second clock terminal, a second electrode of the ninth transistor is coupled to a first electrode of the tenth transistor, and a second electrode of the tenth transistor is coupled to the fourth node;

a gate of the eleventh transistor is coupled to the first node, a first electrode of the eleventh transistor is coupled to the second power terminal, and a second electrode of the eleventh transistor is coupled to the fourth node;

a first terminal of the second capacitor is coupled to the gate of the ninth transistor, and a second terminal of the second capacitor is coupled to the second electrode of the ninth transistor; and a gate of the twelfth transistor is coupled to the first power terminal, a first electrode of the twelfth transistor is coupled to the first node, and a second electrode of the twelfth transistor is coupled to the fifth node.

In some embodiments, the output circuit includes: a first output sub-circuit and a second output sub-circuit; wherein the first output sub-circuit is coupled to the fourth node, the second power terminal and the output terminal, and is configured to control the connection or disconnection between the second power terminal and the output terminal in response to the potential at the fourth node; and the second output sub-circuit is coupled to the fifth node, the first power terminal and the output terminal, and is configured to control the connection or disconnection between the first power terminal and the output terminal in response to the potential at the fifth node.

In some embodiments, the first output sub-circuit includes a thirteenth transistor and a third capacitor; and the second output sub-circuit includes a fourteenth transistor; wherein a gate of the thirteenth transistor is coupled to the fourth node, a first electrode of the thirteenth transistor is coupled to the second power terminal, and a second electrode of the thirteenth transistor is coupled to the output terminal;

a first terminal of the third capacitor is coupled to the gate of the thirteenth transistor, and a second terminal of the third capacitor is coupled to the first electrode of the thirteenth transistor; and a gate of the fourteenth transistor is coupled to the fifth node, a first electrode of the fourteenth transistor is coupled to the first power terminal, and a second electrode of the fourteenth transistor is coupled to the output terminal.

In some embodiments, the shift register unit further includes: a fourth control circuit; wherein the fourth control circuit is coupled to a discharge control terminal, the second power terminal and the first node, and is configured to control connection or disconnection between the second power terminal and the first node in response to a discharge control signal provided by the discharge control terminal.

In some embodiments, the fourth control circuit includes: a fifteenth transistor; wherein a gate of the fifteenth transistor is coupled to the discharge control terminal, a first electrode of the fifteenth transistor is coupled to the second power terminal, and a second electrode of the fifteenth transistor is coupled to the first node.

In some embodiments, the shift register unit further includes:
a fifth control circuit, coupled to the first power terminal, the third node and an eighth node, and configured to control the third node to be connected to the eighth node in response to the first power signal;
wherein the eighth node is coupled to the second input circuit, or the eighth node is coupled to the second control circuit.

In some embodiments, the fifth control circuit includes: a sixteenth transistor; wherein
a gate of the sixteenth transistor is coupled to the first power terminal, a first electrode of the sixteenth transistor is coupled to the eighth node, and a second electrode of the sixteenth transistor is coupled to the third node.

In some embodiments of the present disclosure, a shift register unit is provided. The shift register unit includes:
a first input transistor, wherein a gate of the first input transistor is coupled to a first clock terminal, a first electrode of the first input transistor is coupled to an input terminal, and a second electrode of the first input transistor is coupled to a first node, and the first input transistor is configured to control connection or disconnection between the input terminal and the first node in response to a first clock signal provided by the first clock terminal;
a second input transistor, wherein a gate and a first electrode of the second input transistor are coupled to a second node, and a second electrode of the second input transistor is coupled to the first node, and the second input transistor is configured to control connection or disconnection between the second node and the first node in response to a potential at the second node;
a second input circuit, coupled to the first node, the first clock terminal and a third node, and configured to control connection or disconnection between the first clock terminal and the third node in response to a potential at the first node;
a first control circuit, coupled to the input terminal, the first clock terminal and the second node, and configured to control connection or disconnection between the input terminal and the second node in response to the first clock signal;
a second control circuit, coupled to the third node, a second clock terminal, the first node, a first power terminal, a fourth node and a fifth node, and configured to control connection or disconnection between the second clock terminal and the fourth node in response to a potential at the third node and a second clock signal provided by the second clock terminal, and control the first node to be connected to the fifth node in response to a first power signal provided by the first power terminal; and
an output circuit, coupled to the fourth node, the fifth node, the first power terminal, a second power terminal and an output terminal, and configured to control connection or disconnection between the second power terminal and the output terminal in response to a potential at the fourth node, and control connection or disconnection between the first power terminal and the output terminal in response to a potential at the fifth node.

In some embodiments, the second input circuit is further coupled to the first power terminal, and is configured to control connection or disconnection between the first power terminal and the third node in response to the first clock signal;
the second input circuit includes a third transistor and a fourth transistor; wherein
a gate of the third transistor is coupled to the first node, a first electrode of the third transistor is coupled to the first clock terminal, and a second electrode of the third transistor is coupled to the third node; and
a gate of the fourth transistor is coupled to the first clock terminal, a first electrode of the fourth transistor is coupled to the first power terminal, and a second electrode of the fourth transistor is coupled to the third node.

In some embodiments, the first control circuit is further coupled to the second power terminal, the second clock terminal and the third node, and is configured to control connection or disconnection between the second power terminal and the second node in response to the potential at the third node, and control connection or disconnection between the second clock terminal and the second node in response to the potential at the second node;
the first control circuit includes a fifth transistor, a sixth transistor, a seventh transistor, and a first capacitor; wherein
a gate of the fifth transistor is coupled to the first clock terminal, a first electrode of the fifth transistor is coupled to the input terminal, and a second electrode of the fifth transistor is coupled to the second node;
a gate of the sixth transistor is coupled to the third node, a first electrode of the sixth transistor is coupled to the second power terminal, and a second electrode of the sixth transistor is coupled to a second electrode of the seventh transistor;
a gate of the seventh transistor is coupled to the second node, and a first electrode of the seventh transistor is coupled to the second clock terminal; and
a first terminal of the first capacitor is coupled to the second node, and a second terminal of the first capacitor is coupled to the second electrode of the seventh transistor.

In some embodiments, the second control circuit is further coupled to the second power terminal, and is configured to control connection or disconnection between the second power terminal and the fourth node in response to the potential at the first node;
the second control circuit includes a ninth transistor, a tenth transistor, an eleventh transistor, a twelfth transistor, and a second capacitor; wherein
a gate of the ninth transistor is coupled to the third node, a first electrode of the ninth transistor and a gate of the tenth transistor are both coupled to the second clock terminal, a second electrode of the ninth transistor is coupled to a first electrode of the tenth transistor, and a second electrode of the tenth transistor is coupled to the fourth node;
a gate of the eleventh transistor is coupled to the first node, a first electrode of the eleventh transistor is coupled to the second power terminal, and a second electrode of the eleventh transistor is coupled to the fourth node;
a first terminal of the second capacitor is coupled to the gate of the ninth transistor, and a second terminal of the second capacitor is coupled to the second electrode of the ninth transistor; and
a gate of the twelfth transistor is coupled to the first power terminal, a first electrode of the twelfth transistor is coupled to the first node, and a second electrode of the twelfth transistor is coupled to the fifth node.

In some embodiments, the output circuit includes: a thirteenth transistor, a fourteenth transistor, and a third capacitor; wherein
- a gate of the thirteenth transistor is coupled to the fourth node, a first electrode of the thirteenth transistor is coupled to the second power terminal, and a second electrode of the thirteenth transistor is coupled to the output terminal;
- a first terminal of the third capacitor is coupled to the gate of the thirteenth transistor, and a second terminal of the third capacitor is coupled to the first electrode of the thirteenth transistor; and
- a gate of the fourteenth transistor is coupled to the fifth node, a first electrode of the fourteenth transistor is coupled to the first power terminal, and a second electrode of the fourteenth transistor is coupled to the output terminal.

In some embodiments of the present disclosure, a gate driver circuit is provided. The gate driver circuit includes: at least two cascaded shift register units as described in the above embodiments; wherein
- an input terminal of a first stage of shift register unit is coupled to an input enable terminal, and in other stages of shift register units other than the first stage of shift register unit, an input terminal of each stage of shift register unit is coupled to an output terminal of a cascaded previous stage of shift register unit.

In some embodiments of the present disclosure, a display device is provided. The display device includes: a display panel and the gate driver circuit in the above embodiments; wherein
- the display panel includes a plurality of pixels, and the gate driver circuit is coupled to the plurality of pixels and configured to transmit a gate driving signal to the plurality of pixels.

BRIEF DESCRIPTION OF DRAWINGS

For clearer descriptions of the technical solutions in the embodiments of the present disclosure, the accompanying drawings required for describing the embodiments are described below: The accompanying drawings in the following description show merely some embodiments of the present disclosure, and those of ordinary skill in the art may still derive other drawings from these accompanying drawings without creative effort.

DETAILED DESCRIPTION

Figure 1:
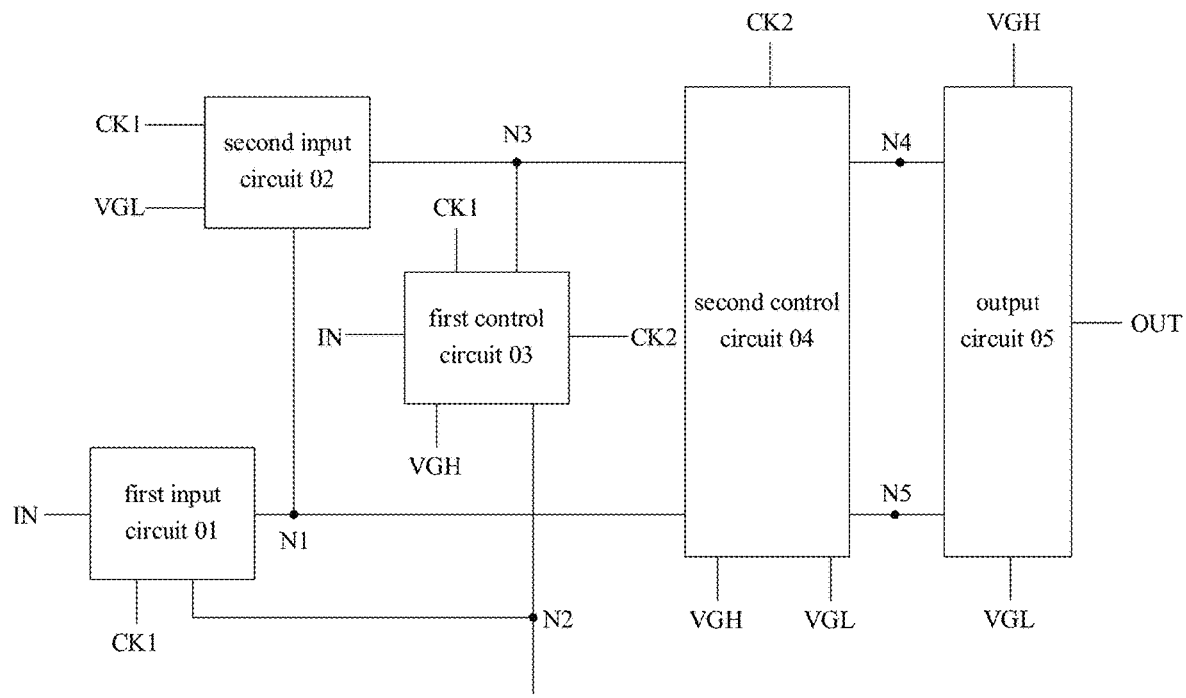
FIG. 1 is a schematic structural diagram of a shift register unit according to some embodiments of the present disclosure.

To make the objectives, technical solutions, and advantages of the present disclosure clearer, the embodiments of the present disclosure will be further described in detail below with reference to the accompanying drawings.

Transistors used in all the embodiments of the present disclosure are thin film transistors or field-effect transistors or other devices having the same characteristics. The transistors used in the embodiments of the present disclosure are mainly switching transistors according to the functions in the circuit. Since a source and a drain of the switching transistor are symmetrical, the source and the drain are interchangeable. In the embodiments of the present disclosure, the source is referred to as a first electrode and the drain is referred to as a second electrode. According to the form in the drawings, an intermediate terminal of the transistor is a control electrode which is also referred to as a gate, a signal input terminal is the source, and a signal output terminal is the drain. In addition, the switching transistors used in the embodiments of the present disclosure include any one of a P-type switching transistor and an N-type switching transistor. The P-type switching transistor is turned on when the gate is at a low level and is turned off when the gate is at a high level, and the N-type switching transistor is turned on when the gate is at a high level and turned off when the gate is at a low level. In addition, a plurality of signals in the embodiments of the present disclosure each correspond to a first potential and a second potential. The first potential and the second potential only represent that the signal has potentials with two different state quantities, but do not represent that the first potential or the second potential has a specific value in the whole text.

In some practices, an AMOLED display device generally includes an AMOLED display panel and a gate driver circuit. The AMOLED display panel includes a plurality of rows of pixels, and the gate driver circuit includes a plurality of cascaded shift register units. Each shift register unit is coupled to one row of pixels and is configured to transmit a gate driving signal to the row of pixels to drive the row of pixels to emit light. The progressive scanning driving of the plurality of rows of pixels is implemented by the plurality of cascaded shift register units, so that the AMOLED display panel displays images.

However, due to the influence of the threshold voltage of the transistor in the shift register unit, a plurality of steps appear when the potential of the gate drive signal transmitted by the shift register unit jumps in some practices, that is, signal smearing occurs. As a result, the output stability of the shift register unit is poor.

FIG. 1 is a schematic structural diagram of a shift register unit according to some embodiments of the present disclosure. As shown in FIG. 1, the shift register unit includes a first input circuit 01, a second input circuit 02, a first control circuit 03, a second control circuit 04, and an output circuit 05.

The first input circuit 01 is coupled to (i.e., electrically connected to) a first clock terminal CK1, an input terminal IN, a first node N1 and a second node N2. The first input circuit 01 is configured to control connection or disconnection between the input terminal IN and the first node N1 in response to a first clock signal provided by the first clock terminal CK1, and control connection or disconnection between the second node N2 and the first node N1 in response to a potential at the second node N2.

For example, the first input circuit 01 controls the input terminal IN to be connected to the first node N1 when a potential of the first clock signal provided by the first clock terminal CK1 is a first potential. In this case, an input signal provided by the input terminal IN is transmitted (also referred to as "written") to the first node N1. The first input circuit 01 controls the input terminal IN to be disconnected from the first node N1 when the potential of the first clock signal is a second potential. Similarly, the first input circuit 01 controls the second node N2 to be connected to the first node N1 when the potential at the second node N2 is the first potential. In this case, the potential at the second node N2 is further transmitted to the first node N1. The first input circuit 01 controls the second node N2 to be disconnected from the first node N1 when the potential at the second node N2 is the second potential. That is, the first input circuit 01 not only controls the potential at the first node N1 based on the first clock signal and the input signal, but also controls the potential at the first node N1 based on the potential at the second node N2.

In some embodiment of the present disclosure, the first potential is an effective potential, and the second potential is an ineffective potential. In addition, the first potential is a low potential, and the second potential is a high potential, that is, the first potential is lower than the second potential. The transistor in the circuit with such potential is a P-type transistor. If the transistor in the circuit is an N-type transistor, the first potential is a high potential, and the second potential is a low potential, that is, the first potential is higher than the second potential. The above is not described again in the following embodiments.

The second input circuit 02 is coupled to the first node N1, the first clock terminal CK1, a first power terminal VGL and a third node N3. The second input circuit 02 is configured to control connection or disconnection between the first clock terminal CK1 and the third node N3 in response to the potential at the first node N1, and control connection or disconnection between the first power terminal VGL and the third node N3 in response to the first clock signal.

For example, the second input circuit 02 controls the first clock terminal CK1 to be connected to the third node N3 when the potential at the first node N1 is the first potential. In this case, the first clock signal provided by the first clock terminal CK1 is transmitted to the third node N3. The second input circuit 02 controls the first clock terminal CK1 to be disconnected from the third node N3 when the potential at the first node N1 is the second potential.

Similarly, the second input circuit 02 controls the first power terminal VGL to be connected to the third node N3 when the potential of the first clock signal is the first potential. In this case, the first power signal provided by the first power terminal VGL is transmitted to the third node N3. The second input circuit 02 controls the first power terminal VGL to be disconnected from the third node N3 when the potential of the first clock signal is the second potential. In some embodiment of the present disclosure, the potential of the first power signal is a low potential.

The first control circuit 03 is coupled to the input terminal IN, the first clock terminal CK1, the second node N2, a second power terminal VGH, a second clock terminal CK2 and the third node N3. The first control circuit 03 is configured to control connection or disconnection between the input terminal IN and the second node N2 in response to the first clock signal, control connection or disconnection between the second power terminal VGH and the second node N2 in response to the potential at the third node N3, and control connection or disconnection between the second clock terminal CK2 and the second node N2 in response to the potential at the second node N2.

For example, the first control circuit 03 controls the input terminal IN to be connected to the second node N2 when the potential of the first clock signal is the first potential. In this case, the input signal provided by the input terminal IN is transmitted to the second node N2. Similarly, the first control circuit 03 controls the input terminal IN to be disconnected from the second node N2 when the potential of the first clock signal is the second potential.

Similarly, the first control circuit 03 controls the second power terminal VGH to be connected to the second node N2 when the potential at the third node N3 is the first potential. In this case, a second power signal provided by the second power terminal VGH is transmitted to second node N2. The first control circuit 03 controls the second power terminal VGH to be disconnected from the second node N2 when the potential at the third node N3 is the second potential. In some the embodiment of the present disclosure, the potential of the second power signal is a high potential.

In addition, the first control circuit 03 controls the second clock terminal CK2 to be connected to the second node N2 when the potential at the second node N2 is the first potential. In this case, the second clock signal provided by the second clock terminal CK2 is transmitted to the second node N2. The first control circuit 03 controls the second clock terminal CK2 to be disconnected from the second node N2 when the potential at the second node N2 is the second potential.

The second control circuit 04 is coupled to the third node N3, the second clock terminal CK2, the first node N1, the first power terminal VGL, the second power terminal VGH, a fourth node N4 and a fifth node N5. The second control circuit 04 is configured to control connection or disconnection between the second clock terminal CK2 and the fourth node N4 in response to the potential at the third node N3 and the second clock signal provided by the second clock terminal CK2, control connection or disconnection between the second power terminal VGH and the fourth node N4 in response to the potential at the first node N1, and control the first node N1 to be connected to the fifth node N5 in response to the first power signal provided by the first power terminal VGL. That is, the fifth node N5 is in a connected state with the first node N1.

For example, the second control circuit 04 controls the second clock terminal CK2 to be connected to the fourth node N4 when the potential at the third node N3 is the first potential and the potential of the second clock signal provided by the second clock terminal CK2 is the first potential. In this case, the second clock signal provided by the second clock terminal CK2 is transmitted to the fourth node N4. The second control circuit 04 controls the second clock terminal CK2 to be disconnected from the fourth node N4 when the potential at the third node N3 is the second potential and/or the potential of the second clock signal is the second potential.

Similarly, the second control circuit 04 controls the second power terminal VGH to be connected to the fourth node N4 when the potential at the first node N1 is the first potential. In this case, the second power signal provided by the second power terminal VGH is transmitted to the fourth node N4. The second control circuit 04 controls the second power terminal VGH to be disconnected from the fourth node N4 when the potential at the first node N1 is the second potential.

The output circuit 05 is coupled to the fourth node N4, the fifth node N5, the first power terminal VGL, the second power terminal VGH, and an output terminal OUT. The output circuit 05 is configured to control connection or disconnection between the second power terminal VGH and the output terminal OUT in response to a potential at the fourth node N4, and control connection or disconnection between the first power terminal VGL and the output terminal OUT in response to a potential at the fifth node N5.

For example, the output circuit 05 controls the second power terminal VGH to be connected to the output terminal OUT when the potential at the fourth node N4 is the first potential. In this case, the second power signal provided by the second power terminal VGH is transmitted to the output terminal OUT. The output circuit 05 controls the second power terminal VGH to be disconnected from the output terminal OUT when the potential at the fourth node N4 is the second potential.

In summary, the embodiments of the present disclosure provide a shift register unit, including two input circuits, two control circuits and one output circuit. The input circuits can control the potential at the first node and the potential at the third node based on the clock signal provided by the coupled clock terminal, the power signal provided by the power terminal, and the potential at the second node. The control circuits can control the potential at the fourth node and the potential at the fifth node based on the clock signal provided by the coupled clock terminal, the power signal provided by the power terminal, and the potentials at the first node, the second node and the third node. The output circuit can transmit the first power signal or the second power signal to the output terminal based on the potential at the fourth node and the potential at the fifth node. In this way, the signal provided by each signal terminal can be flexibly set such that the signal at the required potential is reliably transmitted to the fourth node and the fifth node. Thus, the output circuit is fully and quickly turned on or off, thereby preventing steps from appearing when the potential of the signal transmitted to the output terminal jumps, that is, preventing signal smearing of the output signal and ensuring the good output stability.

Figure 2:
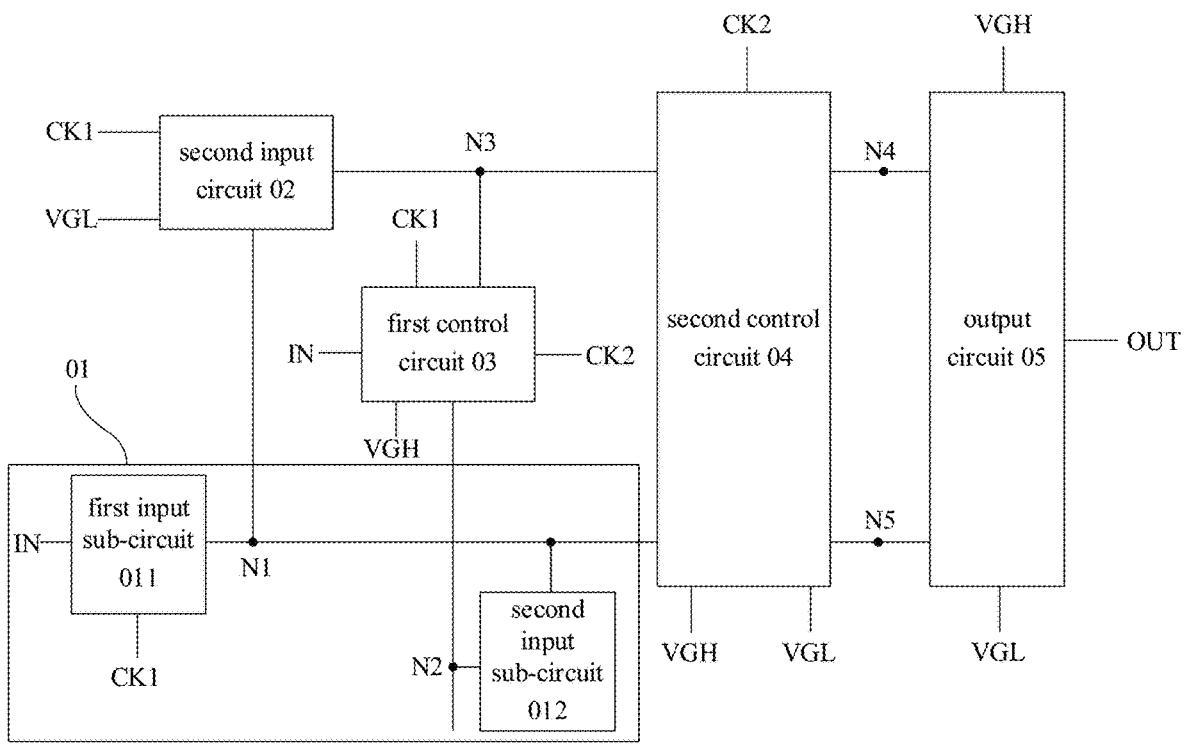
FIG. 2 is a schematic structural diagram of another shift register unit according to some embodiments of the present disclosure.

FIG. 2 is a schematic structural diagram of another shift register unit according to some embodiments of the present disclosure. As shown in FIG. 2, the first input circuit 01 described in the embodiments of the present disclosure includes a first input sub-circuit 011 and a second input sub-circuit 012.

The first input sub-circuit 011 is coupled to the first clock terminal CK1, the input terminal IN and the first node N1, and is configured to control connection or disconnection between the input terminal IN and the first node N1 in response to the first clock signal provided by the first clock terminal CK1.

For example, the first input sub-circuit 011 controls the input terminal IN to be connected to the first node N1 when the potential of the first clock signal provided by the first clock terminal CK1 is the first potential, and controls the input terminal IN to be disconnected from the first node N1 when the potential of the first clock signal is the second potential.

The second input sub-circuit 012 is coupled to the second node N2 and the first node N1, and is configured to control connection or disconnection between the second node N2 and the first node N1 in response to the potential at the second node N2. That is, the second input sub-circuit 012 is connected in series between the second node N2 and the first node N1, and controls the potential at the first node N1 based on the potential at the second node N2.

For example, the second input sub-circuit 012 controls the second node N2 to be connected to the first node N1 when the potential at the second node N2 is the first potential, and controls the second node N2 to be disconnected from the first node N1 when the potential at the second node N2 is the second potential.

Figure 3:
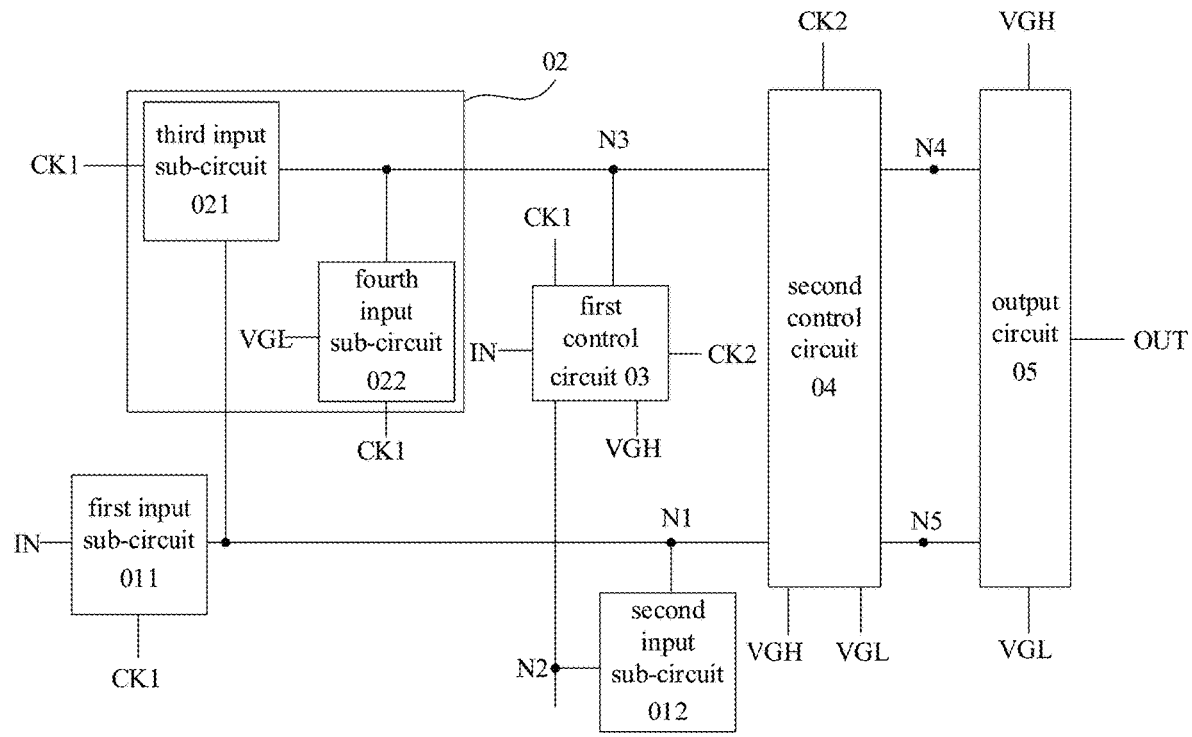
FIG. 3 is a schematic structural diagram of still another shift register unit according to some embodiments of the present disclosure.

FIG. 3 is a schematic structural diagram of still another shift register unit according to some embodiments of the present disclosure. As shown in FIG. 3, the second input circuit 02 described in the embodiments of the present disclosure includes a third input sub-circuit 021 and a fourth input sub-circuit 022.

The third input sub-circuit 021 is coupled to the first node N1, the first clock terminal CK1 and the third node N3, and is configured to control connection or disconnection between the first clock terminal CK1 and the third node N3 in response to the potential at the first node N1.

For example, the third input sub-circuit 021 controls the first clock terminal CK1 to be connected to the third node N3 when the potential at the first node N1 is the first potential, and controls the first clock terminal CK1 to be disconnected from the third node N3 when the potential at the first node N1 is the second potential.

The fourth input sub-circuit 022 is coupled to the first clock terminal CK1, the first power terminal VGL and the third node N3, and is configured to control connection or disconnection between the first power terminal VGL and the third node N3 in response to the first clock signal.

For example, the fourth input sub-circuit 022 controls the first power terminal VGL to be connected to the third node N3 when the potential of the first clock signal is the first potential, and controls the first power terminal VGL to be disconnected from the third node N3 when the potential of the first clock signal is the second potential.

Figure 4:
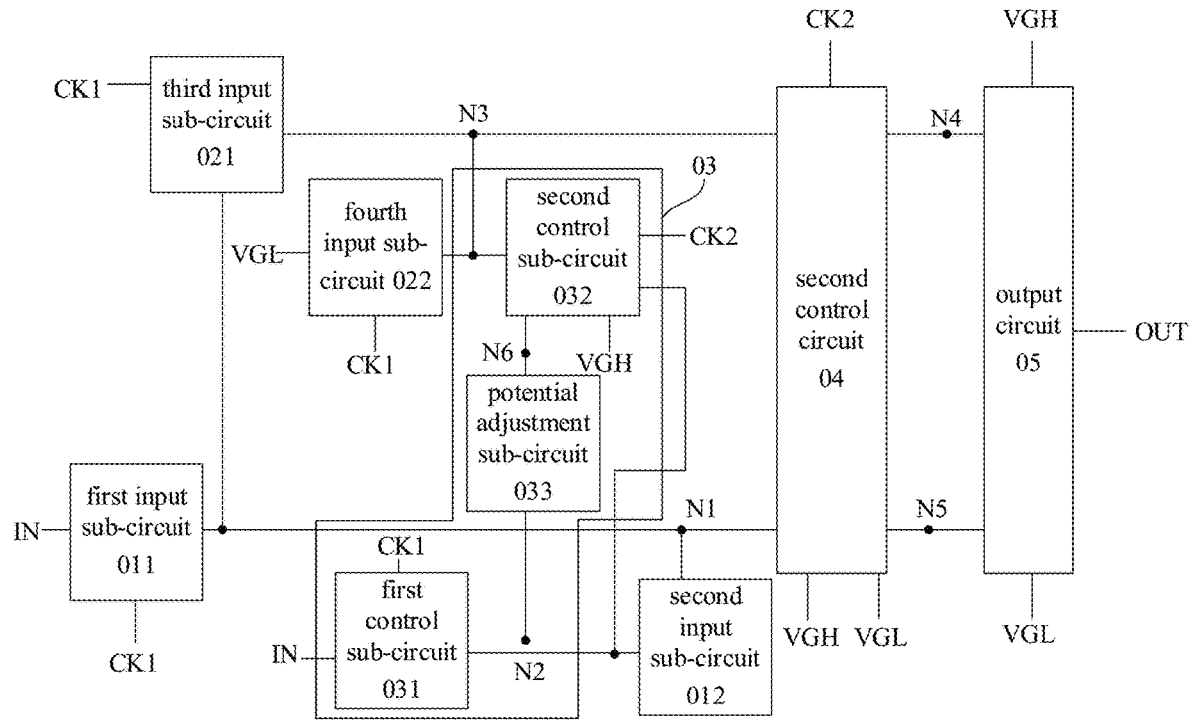
FIG. 4 is a schematic structural diagram of yet another shift register unit according to some embodiments of the present disclosure.

FIG. 4 is a schematic structural diagram of yet another shift register unit according to some embodiment of the present disclosure. As shown in FIG. 4, the first control circuit 03 described in the embodiments of the present disclosure includes a first control sub-circuit 031, a second control sub-circuit 032 and a potential adjustment sub-circuit 033.

The first control sub-circuit 031 is coupled to the first clock terminal CK1, the input terminal IN and the second node N2, and is configured to control connection or disconnection between the input terminal IN and the second node N2 in response to the first clock signal.

For example, the first control sub-circuit 031 controls the input terminal IN to be connected to the second node N2 when the potential of the first clock signal is the first potential, and controls the input terminal IN to be disconnected from the second node N2 when the potential of the first clock signal is the second potential.

The second control sub-circuit 032 is coupled to the second node N2, the second power terminal VGH, the third node N3, the second clock terminal CK2, and a sixth node N6. The second control sub-circuit 032 is configured to control connection or disconnection between the second power terminal VGH and the sixth node N6 in response to the potential at the third node N3, and control connection or disconnection between the second clock terminal CK2 and the sixth node N6 in response to the potential at the second node N2.

For example, the second control sub-circuit 032 controls the second power terminal VGH to be connected to the sixth node N6 when the potential at the third node N3 is the first potential. In this case, the second power signal provided by the second power terminal VGH is transmitted to the sixth node N6. The second control sub-circuit 032 controls the second power terminal VGH to be disconnected from the sixth node N6 when the potential at the third node N3 is the second potential.

Similarly, the second control sub-circuit 032 controls the second clock terminal CK2 to be connected to the sixth node N6 when the potential at the second node N2 is the first potential. In this case, the second clock signal provided by the second clock terminal CK2 is transmitted to the sixth node N6. The second control sub-circuit 032 controls the second clock terminal CK2 to be disconnected from the sixth node N6 when the potential at the second node N2 is the second potential.

The potential adjustment sub-circuit 033 is coupled to the second node N2 and the sixth node N6, and is configured to adjust the potential at the second node N2 and the potential at the sixth node N6.

Figure 5:
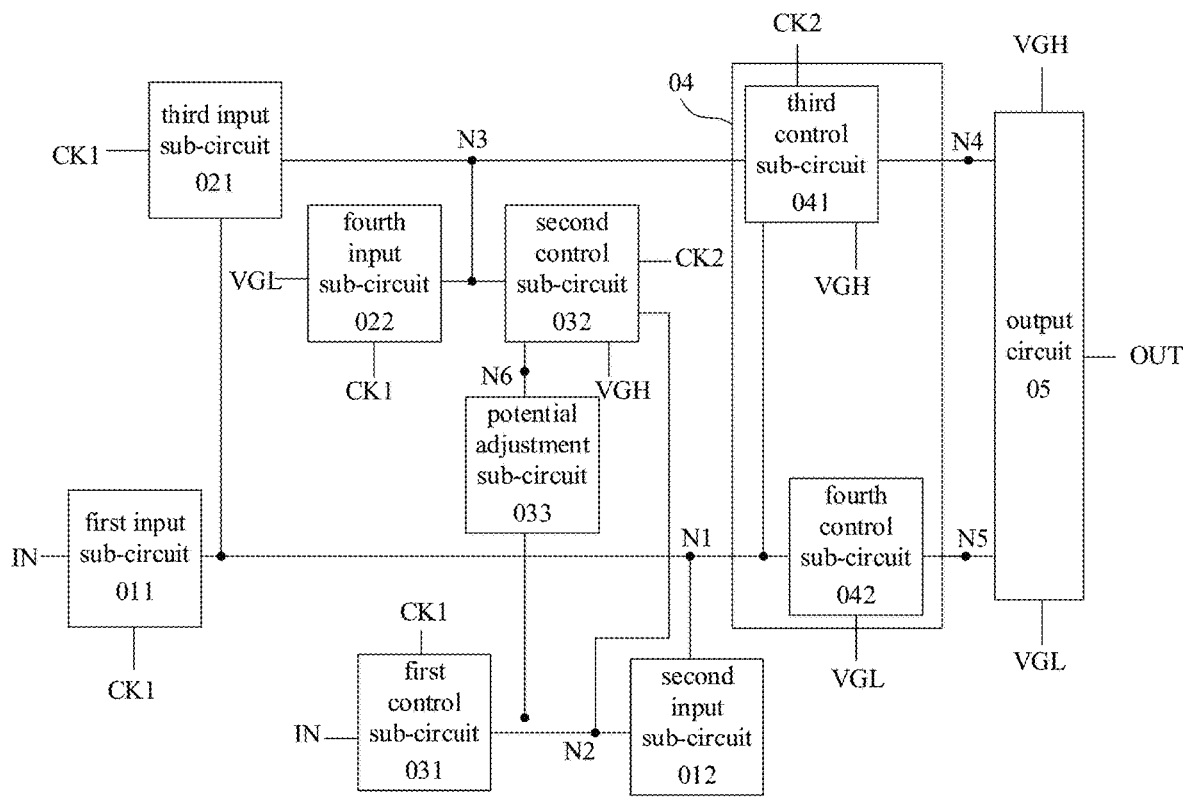
FIG. 5 is a schematic structural diagram of yet another shift register unit according to some embodiments of the present disclosure.

FIG. 5 is a schematic structural diagram of yet another shift register unit according to some embodiments of the present disclosure. As shown in FIG. 5, the second control circuit 04 described in the embodiments of the present disclosure includes a third control sub-circuit 041 and a fourth control sub-circuit 042.

The third control sub-circuit 041 is coupled to the third node N3, the second clock terminal CK2, the second power terminal VGH, the first node N1 and the fourth node N4. The third control sub-circuit 041 is configured to control connection or disconnection between the second clock terminal CK2 and the fourth node N4 in response to the potential at the third node N3 and the second clock signal, and control connection or disconnection between the second power terminal VGH and the fourth node N4 in response to the potential at the first node N1.

For example, the third control sub-circuit 041 controls the second clock terminal CK2 to be connected to the fourth node N4 when the potential at the third node and the potential of the second clock signal are both the first potential, and controls the second clock terminal CK2 to be disconnected from the fourth node N4 when the potential at the third node N3 is the second potential and/or the potential of the second clock signal is the second potential. Similarly, the third control sub-circuit 041 controls the second power terminal VGH to be connected to the fourth node N4 when the potential at the first node N1 is the first potential, and controls the second power terminal VGH to be disconnected from the fourth node N4 when the potential at the first node N1 is the second potential.

The fourth control sub-circuit 042 is coupled to the first power terminal VGL, the first node N1 and the fifth node N5, and is configured to control the first node N1 to be connected to the fifth node N5 in response to the first power signal.

Figure 6:
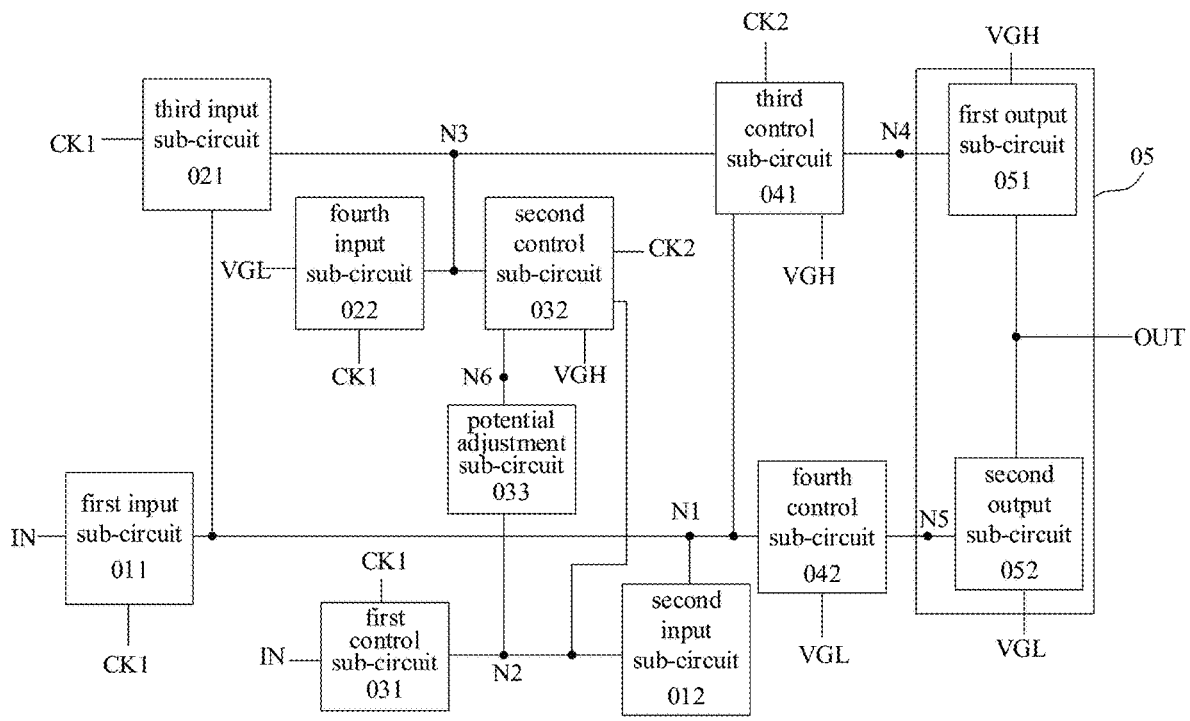
FIG. 6 is a schematic structural diagram of yet another shift register unit according to some embodiments of the present disclosure.

FIG. 6 is a schematic structural diagram of yet another shift register unit according to some embodiments of the present disclosure. As shown in FIG. 6, the output circuit 05 described in the embodiments of the present disclosure includes a first output sub-circuit 051 and a second output sub-circuit 052.

The first output sub-circuit 051 is coupled to the fourth node N4, the second power terminal VGH and the output terminal OUT, and is configured to control connection or disconnection between the second power terminal VGH and the output terminal OUT in response to the potential at the fourth node N4.

For example, the first output sub-circuit 051 controls the second power terminal VGH to be connected to the output terminal OUT when the potential at the fourth node N4 is the first potential, and controls the second power terminal VGH to be disconnected from the output terminal OUT when the potential at the fourth node N4 is the second potential.

The second output sub-circuit 052 is coupled to the fifth node N5, the first power terminal VGL and the output terminal OUT, and is configured to control connection or disconnection between the first power terminal VGL and the output terminal OUT in response to the potential at the fifth node N5.

For example, the second output sub-circuit 052 controls the first power terminal VGL to be connected to the output terminal OUT when the potential at the fifth node N5 is the first potential, and controls the first power terminal VGL to be disconnected from the output terminal OUT when the potential at the fifth node N5 is the second potential.

Figure 7:
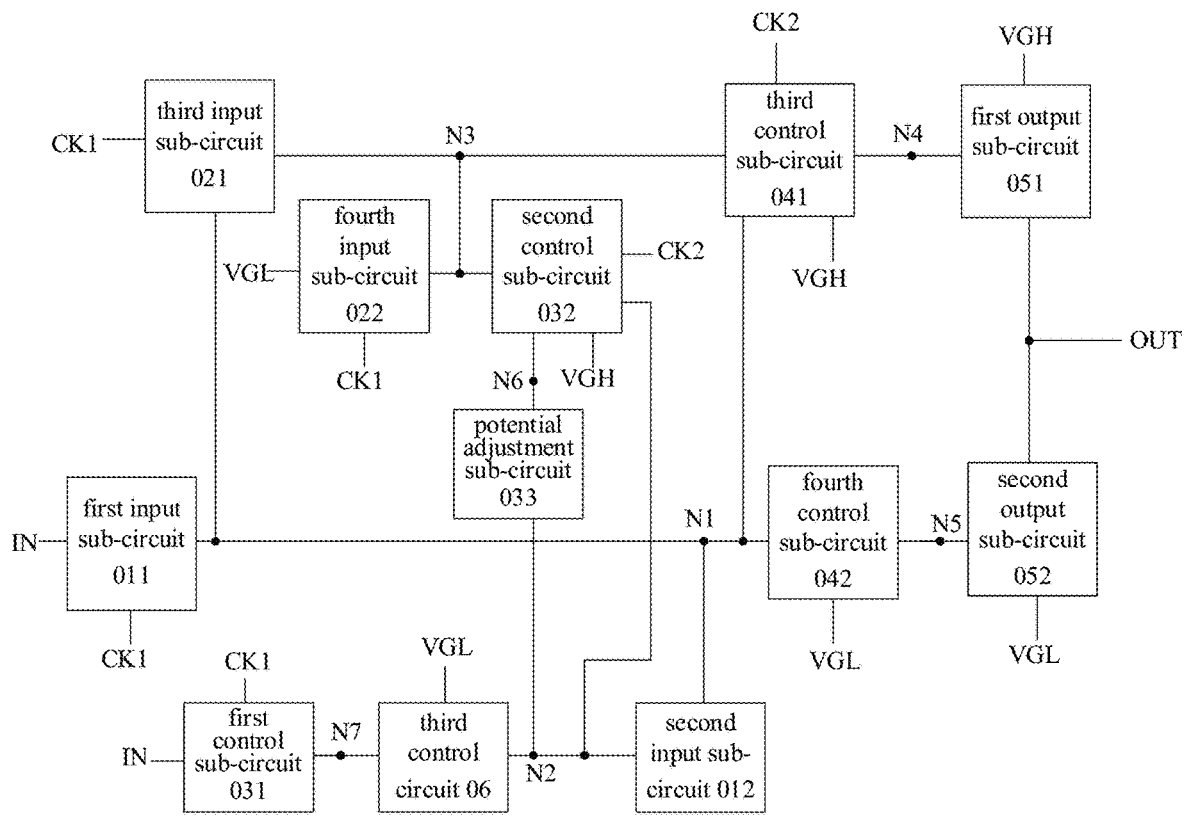
FIG. 7 is a schematic structural diagram of yet another shift register unit according to some embodiments of the present disclosure.

FIG. 7 is a schematic structural diagram of yet another shift register unit according to some embodiments of the present disclosure. As shown in FIG. 7, the shift register unit described in the embodiments of the present disclosure further includes a third control circuit 06.

The third control circuit 06 is coupled to the first power terminal VGL, a seventh node N7 and the second node N2, and is configured to control the seventh node N7 to be connected to the second node N2 in response to the first power signal. The seventh node N7 is coupled to the first control sub-circuit 031, that is, the third control circuit 06 is connected in series between the first control sub-circuit 031 and the second node N2.

Figure 8:
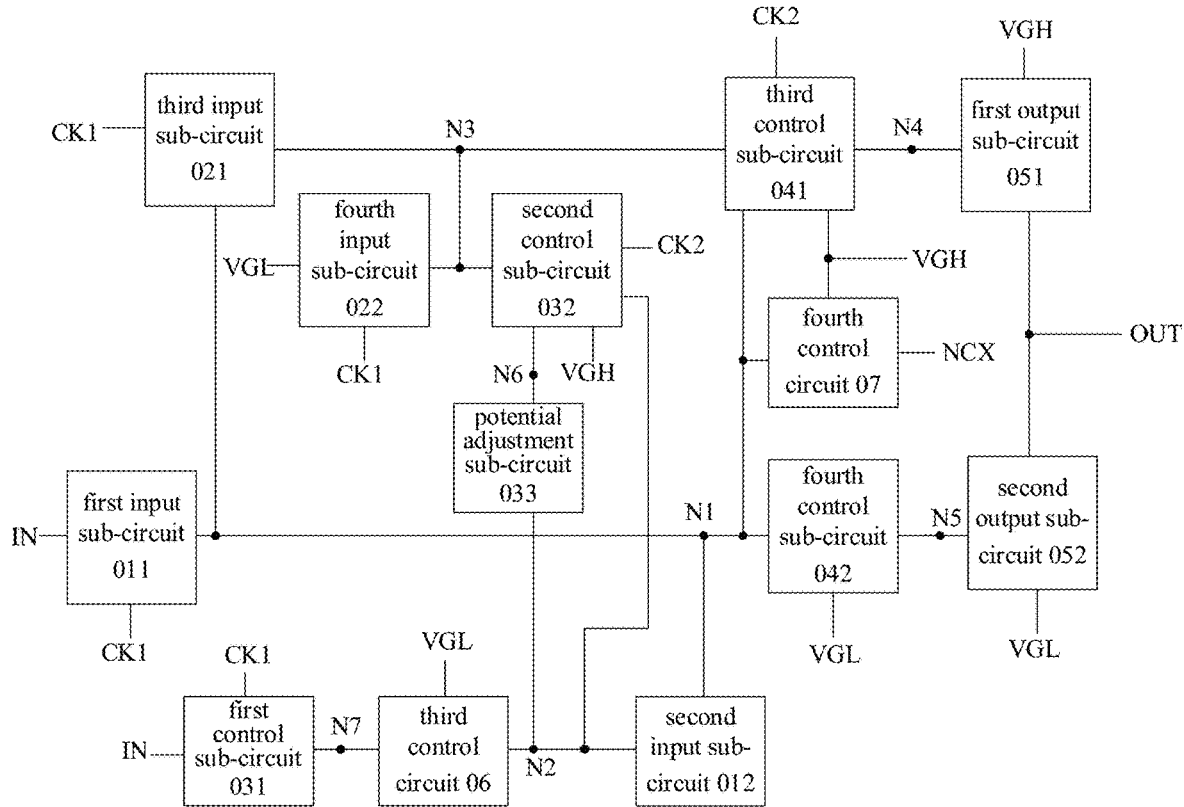
FIG. 8 is a schematic structural diagram of yet another shift register unit according to some embodiments of the present disclosure.

FIG. 8 is a schematic structural diagram of yet another shift register unit according to some embodiments of the present disclosure. As shown in FIG. 8, the shift register unit described in the embodiments of the present disclosure further includes a fourth control circuit 07.

The fourth control circuit 07 is coupled to a discharge control terminal NCX, the second power terminal VGH and the first node N1, and is configured to control connection or disconnection between the second power terminal VGH and the first node N1 in response to a discharge control signal provided by the discharge control terminal NCX.

For example, the fourth control circuit 07 controls the second power terminal VGH to be connected to the first node N1 when the potential of the discharge control signal provided by the discharge control terminal NCX is the first potential. In this case, the second power signal provided by the second power terminal VGH is transmitted to the first node N1. The fourth control circuit 07 controls the second power terminal VGH to be disconnected from the first node N1 when the potential of the discharge control signal is the second potential.

Figure 9:
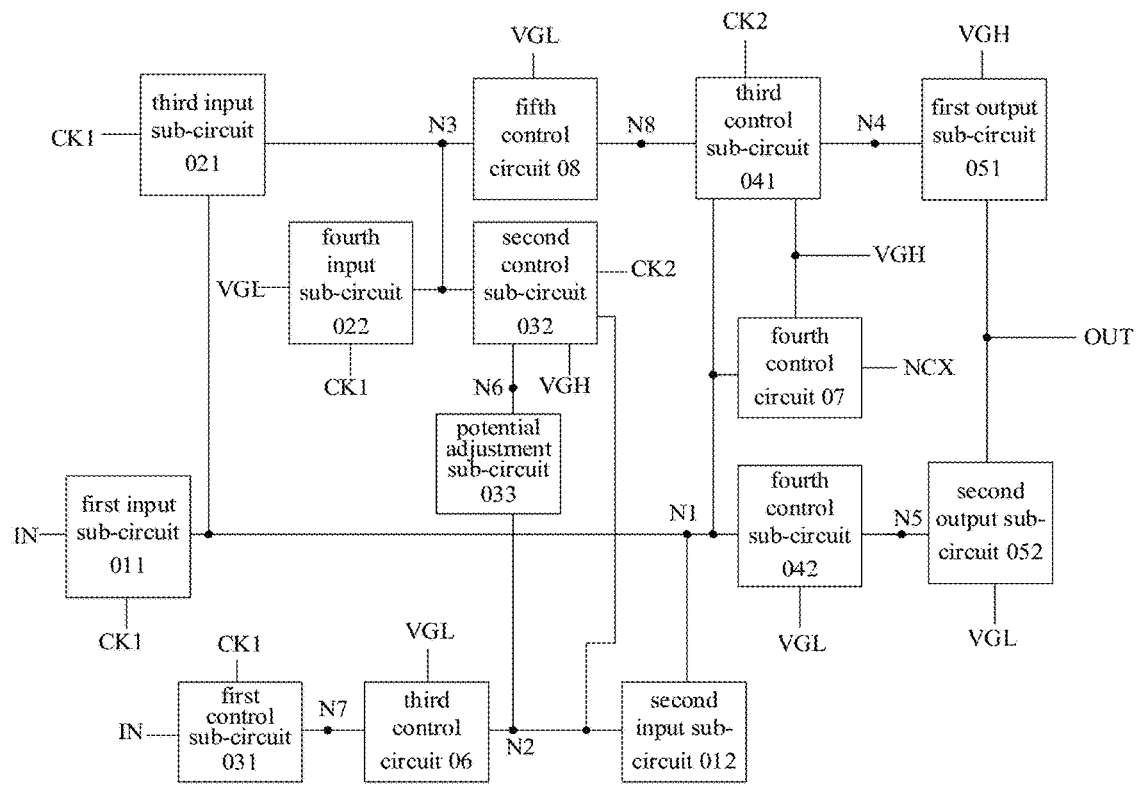
FIG. 9 is a schematic structural diagram of yet another shift register unit according to some embodiments of the present disclosure.

FIG. 9 is a schematic structural diagram of yet another shift register unit according to some embodiments of the present disclosure. As shown in FIG. 9, the shift register unit described in the embodiments of the present disclosure further includes a fifth control circuit 08.

The fifth control circuit 08 is coupled to the first power terminal VGL, the third node N3 and an eighth node N8, and is configured to control the third node N3 to be connected to the eighth node N8 in response to the first power signal.

In some embodiments, as an optional implementation, referring to FIG. 9, the eighth node N8 is coupled to the second input circuit 02. That is, the fifth control circuit 08 is connected in series between the second input circuit 02 and the third node N3.

Figure 10:
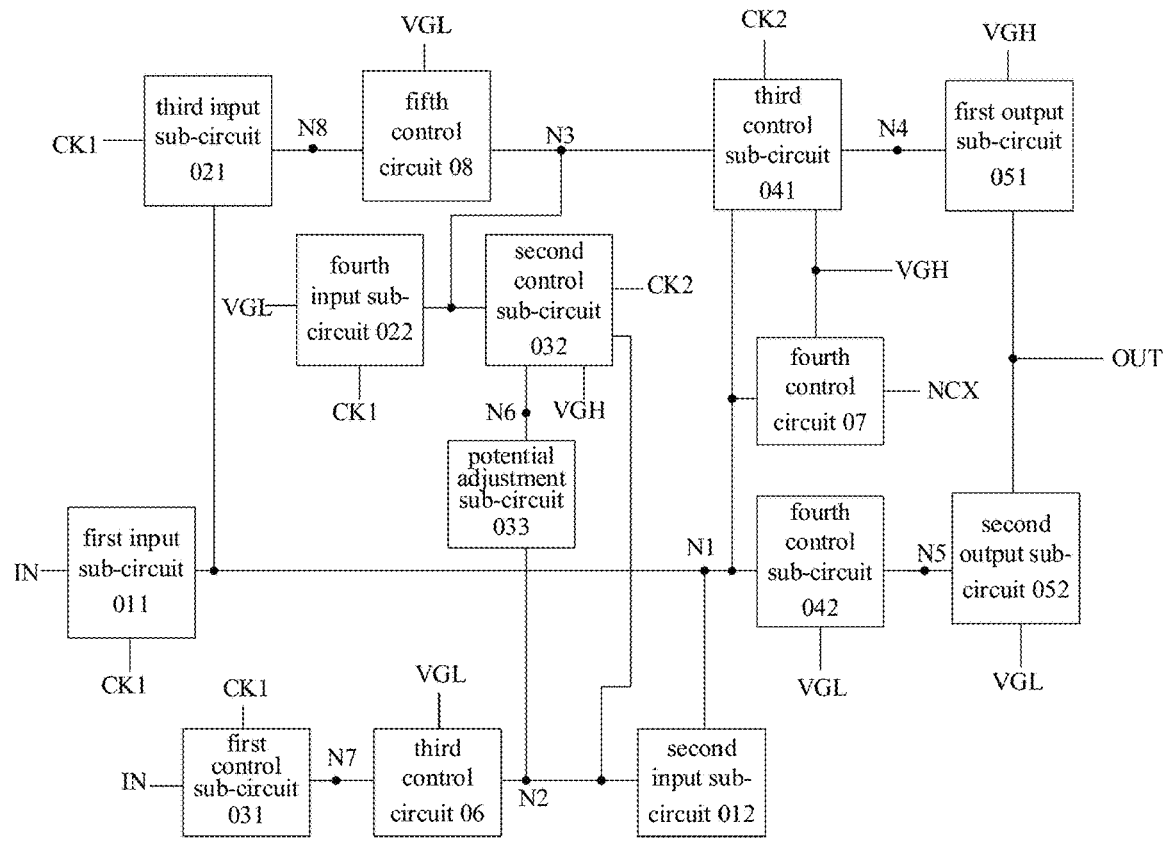
FIG. 10 is a schematic structural diagram of yet another shift register unit according to some embodiments of the present disclosure.
Figure 11:
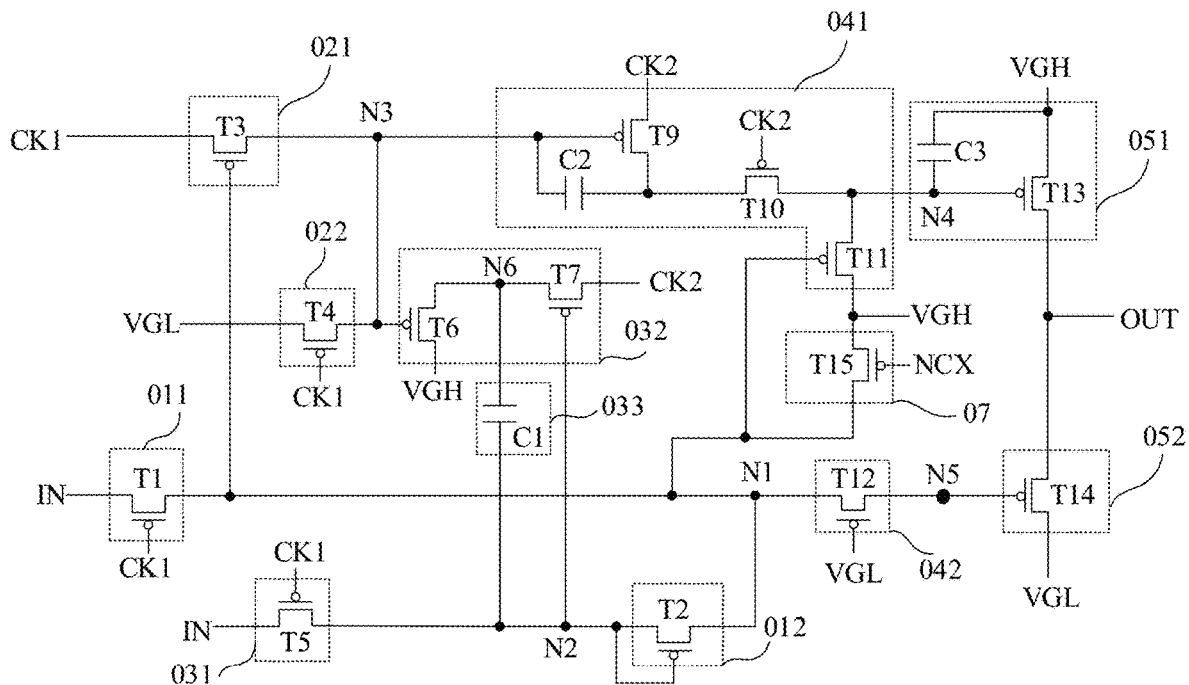
FIG. 11 is a schematic structural diagram of yet another shift register unit according to some embodiments of the present disclosure.

Alternatively, as another optional implementation, as can be seen from FIG. 10 which shows still another shift register unit, the eighth node N8 is coupled to the second control circuit 04. That is, the fifth control circuit 08 is connected in series between the second control circuit 04 and the third node N3.

Taking the above shift register unit as an example, FIG. 11 to FIG. 14 respectively show schematic structural diagrams of four different shift register units. As shown in FIG. 11 to FIG. 14, the first input sub-circuit 011 includes a first transistor T1, and the second input sub-circuit 012 includes a second transistor T2.

A gate of the first transistor T1 is coupled to the first clock terminal CK1, a first electrode of the first transistor T1 is coupled to the input terminal IN, and a second electrode of the first transistor T1 is coupled to the first node N1.

A gate and a first electrode of the second transistor T2 are both coupled to the second node N2, and a second electrode of the second transistor T2 is coupled to the first node N1.

Based on the foregoing embodiments, in the embodiments of the present disclosure, the second input sub-circuit 012 (i.e., the second transistor T2) is coupled between the second node N2 and the first node N1, and is in the form of a diode being coupled in a direction from the first node N1 to the second node N2. Thus, no current flows from the second node N2 into the first node N1. Based on this, when the potential at the second node N2 is greater than the potential at the first node N1, the second transistor T2 is in a backward diode coupled state, and the potential at the first node N1 remains relatively constant. When the potential of the input signal provided by the input terminal IN is the second potential (i.e., the high potential), because the second transistor T2 is used as a backward diode, the potential at the second node N2 does not affect the potential at the first node N1, which can ensure the good stability of the potential at the first node N1. In a state where the potential at the first node N1 remains stable, the potential at the fifth node N5 which is continuously connected to the first node N1 also has good stability, thereby preventing signal smearing of the first power signal transmitted by the second output sub-circuit 052 to the output terminal OUT based on the potential at the fifth node N5.

In addition, the second transistor T2 as a diode which is coupled between the second node N2 and the first node N1 can be used as a charge pump. For example, the potential at the second node N2 which is similar to an alternating current signal may be converted to a direct current signal at the first node N1 by the second transistor T2. Based on this, it can be further seen that, no matter how the potential at the second node N2 changes, the potential at the first node N1 can remain constant and has good stability by means of the charge pump operation of the second transistor T2.

Still referring to FIG. 11 to FIG. 14, the third input sub-circuit 021 includes a third transistor T3, and the fourth input sub-circuit 022 includes a fourth transistor T4.

A gate of the third transistor T3 is coupled to the first node N1, a first electrode of the third transistor T3 is coupled to the first clock terminal CK1, and a second electrode of the third transistor T3 is coupled to the third node N3.

A gate of the fourth transistor T4 is coupled to the first clock terminal CK1, a first electrode of the fourth transistor T4 is coupled to the first power terminal VGL, and a second electrode of the fourth transistor T4 is coupled to the third node N3.

Still referring to FIG. 11 to FIG. 14, the first control sub-circuit 031 includes a fifth transistor T5: the second control sub-circuit 032 includes a sixth transistor T6 and a seventh transistor T7; and the potential adjustment sub-circuit 033 includes a first capacitor C1.

A gate of the fifth transistor T5 is coupled to the first clock terminal CK1, a first electrode of the fifth transistor T5 is coupled to the input terminal IN, and a second electrode of the fifth transistor T5 is coupled to the second node N2.

A gate of the sixth transistor T6 is coupled to the third node N3, a first electrode of the sixth transistor T6 is coupled to the second power terminal VGH, and a second electrode of the sixth transistor T6 is coupled to the sixth node N6.

A gate of the seventh transistor T7 is coupled to the second node N2, a first electrode of the seventh transistor T7 is coupled to the second clock terminal CK2, and a second electrode of the seventh transistor T7 is coupled to the sixth node N6.

A first terminal of the first capacitor C1 is coupled to the second node N2, and a second terminal of the first capacitor C1 is coupled to the sixth node N6.

When the sixth transistor T6 is turned on, the second power signal at the second potential (i.e., the high potential) provided by the second power terminal VGH is transmitted to the sixth node N6. As such, the coupling effect of the first capacitor C1 (also referred to as a boosting effect) is further improved. When the potential of the input signal provided by the input terminal IN is the first potential (i.e., the low potential), and the input signal at the low potential is transmitted to the second node N2, the seventh transistor T7 remains turned-on, and the potential at the sixth node N6 changes with the change of the potential of the second clock signal provided by the second clock terminal CK2. In addition, the first capacitor C1 is coupled between the second node N2 and the sixth node N6, the first capacitor C1 is coupled based on the change of the potential at the sixth node N6, and the potential at the second node N2 may swing within a certain potential range. Thus, the potential at the second node N2 changes with the change of the potential of the second clock signal, thereby realizing flexible and reliable control over the potential at the second node N2.

Still referring to FIG. 11 to FIG. 14, the third control sub-circuit 041 includes a ninth transistor T9, a tenth transistor T10, an eleventh transistor T11, and a second capacitor C2; and the fourth control sub-circuit 042 includes a twelfth transistor T12.

A gate of the ninth transistor T9 is coupled to the third node N3, a first electrode of the ninth transistor T9 and a gate of the tenth transistor T10 are coupled to the second clock terminal CK2, a second electrode of the ninth transistor T9 is coupled to a first electrode of the tenth transistor T10, and a second electrode of the tenth transistor T10 is coupled to the fourth node N4.

A gate of the eleventh transistor T11 is coupled to the first node N1, a first electrode of the eleventh transistor T11 is coupled to the second power terminal VGH, and a second electrode of the eleventh transistor T11 is coupled to the fourth node N4.

A first terminal of the second capacitor C2 is coupled to the gate of the ninth transistor T9, and a second terminal of the second capacitor C2 is coupled to the second electrode of the ninth transistor T9.

A gate of the twelfth transistor T12 is coupled to the first power terminal VGL, a first electrode of the twelfth transistor T12 is coupled to the first node N1, and a second electrode of the twelfth transistor T12 is coupled to the fifth node N5.

The fourth control sub-circuit 042 (i.e., the twelfth transistor T12) is in a normally-on state, which can limit the potential drop amount of the first node N1 and the potential drop amount of the fifth node N5. For example, in some embodiments, when the potential drop amount of the fifth node N5 is large, the twelfth transistor T12 can be used as a resistor, which can divide the potential between the first node N1 and the fifth node N5. In this way, even if the potential at the fifth node N5 changes greatly, the sudden increase of the source-drain voltage of the first transistor T1 can be alleviated or prevented, and therefore the first transistor T1 coupled to the first node N1 can be protected. When the potential at the fifth node N5 drops below the potential of the first power signal, the twelfth transistor T12 can divide the potential, and thus the potential at the first node N1 can remain relatively stable. For example, the potential at the first node N1 is not lower than the potential of the first power signal, and thus the bias stress that may be applied to the first transistor T1 is reduced. In this way, the potential at the first node N1 can be reliably stabilized at the required first potential, such that the potential at the fifth node N5 is also reliably stabilized at the required first potential. Therefore, the transistor included in the second output sub-circuit 052 can be reliably, timely and quickly turned on to transmit the first power signal at the first potential to the output terminal OUT, thereby avoiding the signal smearing of the transmitted first power signal, that is, ensuring the good output stability.

Still referring to FIG. 11 to FIG. 14, the first output sub-circuit 051 includes a thirteenth transistor T13 and a third capacitor C3; and the second output sub-circuit 052 includes a fourteenth transistor T14.

A gate of the thirteenth transistor T13 is coupled to the fourth node N4, a first electrode of the thirteenth transistor T13 is coupled to the second power terminal VGH, and a second electrode of the thirteenth transistor T13 is coupled to the output terminal OUT.

A first terminal of the third capacitor C3 is coupled to the gate of the thirteenth transistor T13, and a second terminal of the third capacitor C3 is coupled to the first electrode of the thirteenth transistor T13.

A gate of the fourteenth transistor T14 is coupled to the fifth node N5, a first electrode of the fourteenth transistor T14 is coupled to the first power terminal VGL, and a second electrode of the fourteenth transistor T14 is coupled to the output terminal OUT.

Still referring to FIG. 11 to FIG. 14, the fourth control circuit 07 includes a fifteenth transistor T15.

A gate of the fifteenth transistor T15 is coupled to the discharge control terminal NCX, a first electrode of the fifteenth transistor T15 is coupled to the second power terminal VGH, and a second electrode of the fifteenth transistor T15 is coupled to the first node N1.

For example, the potential of the discharge control signal provided by the discharge control terminal NCX is set to the first potential at the moment of power-on, such that the fifteenth transistor T15 is reliably turned on, and the second power terminal VGH transmits the second power signal at the second potential (i.e., the high potential) to the first node N1 (i.e., to the fifth node N5) through the fifteenth transistor T15. Thus, the fourteenth transistor T14 is reliably turned off, and the signal output from the output terminal OUT remains at the potential at the previous stage, or remains at the high potential, thereby solving the problem of power-on flash screen.

Figure 12:
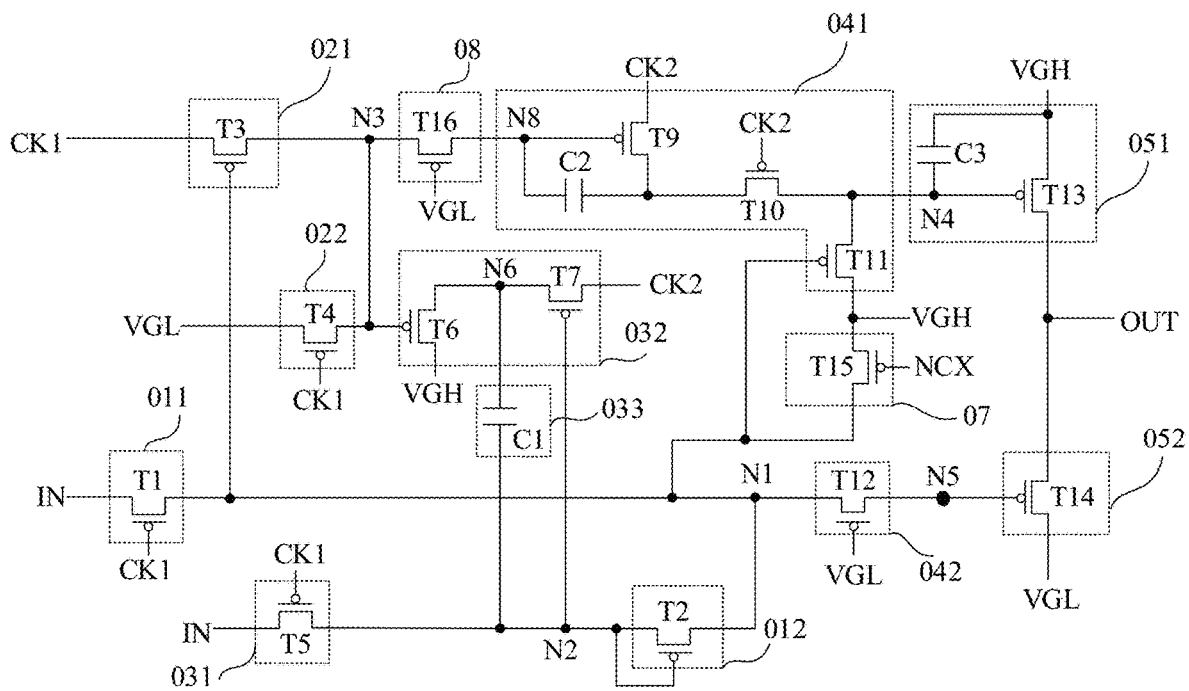
FIG. 12 is a schematic structural diagram of yet another shift register unit according to some embodiments of the present disclosure.
Figure 13:
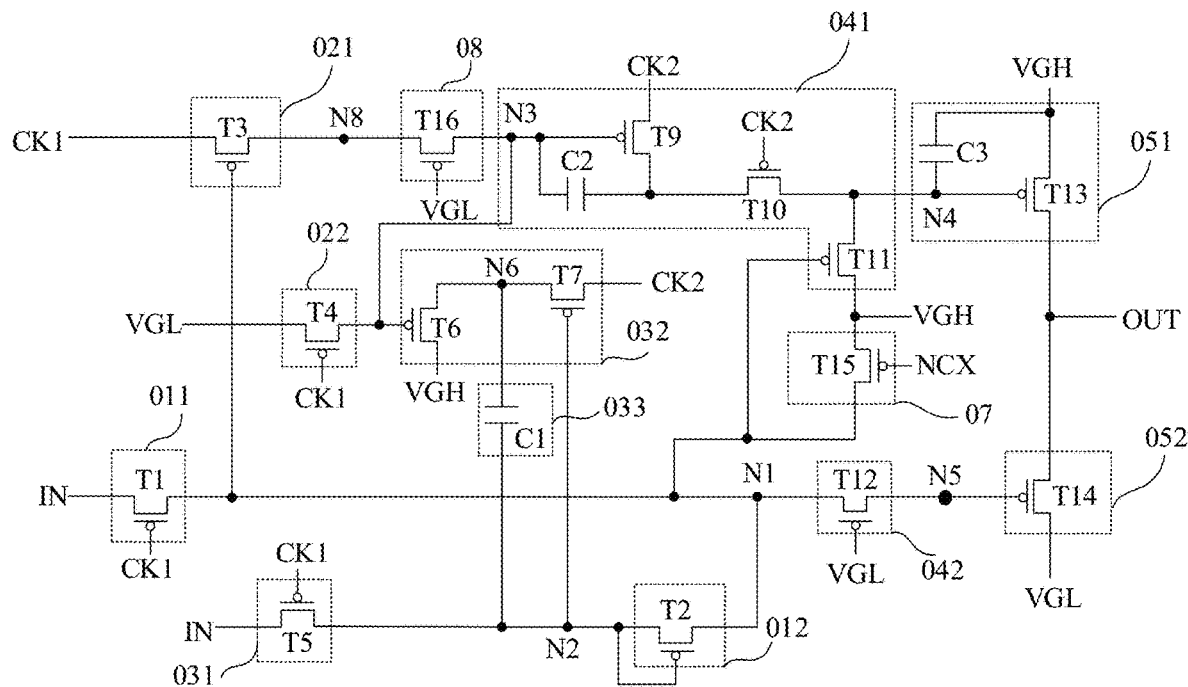
FIG. 13 is a schematic structural diagram of yet another shift register unit according to some embodiments of the present disclosure.

With continued reference to FIG. 12 and FIG. 13, the fifth control circuit 08 includes a sixteenth transistor T16.

A gate of the sixteenth transistor T16 is coupled to the first power terminal VGL, a first electrode of the sixteenth transistor T16 is coupled to the eighth node N8, and a second electrode of the sixteenth transistor T16 is coupled to the third node N3.

In addition, as an optional implementation, for the structure shown in FIG. 12, the eighth node N8 is coupled to the third control sub-circuit 041, and specifically, the eighth node N8 is coupled to the gate of the ninth transistor T9. Alternatively, as another optional implementation, for the structure shown in FIG. 12, the eighth node N8 is coupled to the third input sub-circuit 021, and specifically, the eighth node N8 is coupled to the second electrode of the third transistor T3.

Similar to the twelfth transistor T12, the sixteenth transistor T16 included in the fifth control circuit 08 is also in a normally-on state. On this basis, when the potential at the eighth node N8 drops significantly (e.g., drops below the potential of the first power signal) through the coupling effect of the second capacitor C2, the sixteenth transistor T16 can be used as a resistor to keep the potential at the third node N3 relatively stable, for example, to enable the potential at the third node N3 to be not lower than the potential of the first power signal. Thus, the bias stress that may be applied to the third transistor T3 and the fourth transistor T4 coupled to the third node N3 is mitigated. In this way, the third transistor T3 and the fourth transistor T4 are protected from the potential change at the eighth node N8. That is, the third transistor T3 and the fourth transistor T4 are protected.

Figure 14:
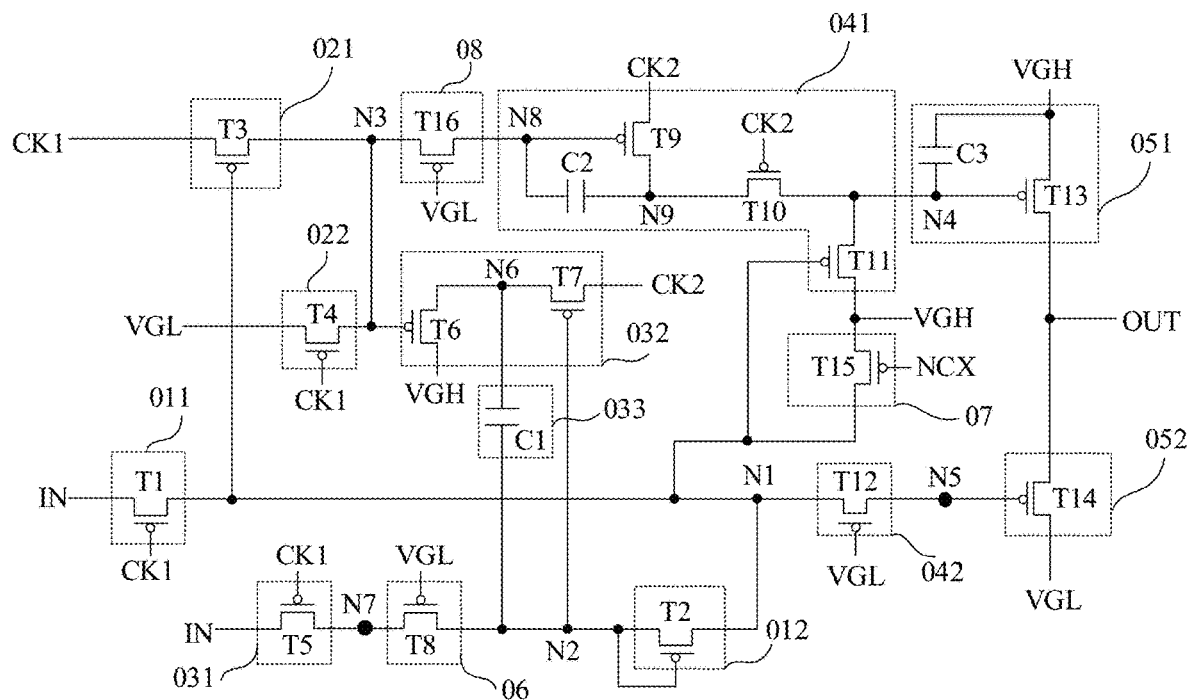
FIG. 14 is a schematic structural diagram of yet another shift register unit according to some embodiments of the present disclosure.

Optionally, as shown in FIG. 14, the third control circuit 06 includes an eighth transistor T8. FIG. 14 shows a shift register unit on the basis of FIG. 12.

A gate of the eighth transistor T8 is coupled to the first power terminal VGL, a first electrode of the eighth transistor T8 is coupled to a seventh node N7, and a second electrode of the eighth transistor T8 is coupled to the second node N2. The seventh node N7 is coupled to the first control sub-circuit 031, and specifically the seventh node N7 is coupled to the second electrode of the fifth transistor T5.

Similar to the twelfth transistor T12 and the sixteenth transistor T16, the eighth transistor T8 is also in a normally-on state. When the potential at the second node N2 drops to be lower than the potential of the first power signal, the eighth transistor T8 can divide the potential at the second node N2, such that the potential at the node (i.e., the seventh node N7) coupled between the fifth transistor T5 and the eighth transistor T8 can remain relatively stable, for example, the potential at the seventh node N7, which may be considered as the potential at the second electrode of the fifth transistor T5, is not lower than the potential of the first power signal. Thus, the bias stress that may be applied to the fifth transistor T5 is also mitigated. That is, the eighth transistor T8 can perform the same function as the twelfth transistor T12 and the sixteenth transistor T16, to protect the fifth transistor T5 from the potential change at the second node N2.

Optionally, as described in the foregoing embodiments, the transistors (for example, the first transistor T1 to the sixteenth transistor T16 shown in FIG. 14) included in the shift register unit in the embodiments of the present disclosure are all P-type transistors. On this basis, as described in the foregoing embodiments, the first potential (i.e., the effective potential) is a low potential, and the second potential (i.e., the ineffective potential) is a high potential.

Optionally, by taking the shift register unit shown in FIG. 14 as an example in which transistors are all P-type transistors, and accordingly, the first potential is a low potential, and the second potential is a high potential, the working principle of the shift register unit described in the embodiments of the present disclosure is described as follows.

Figure 15:
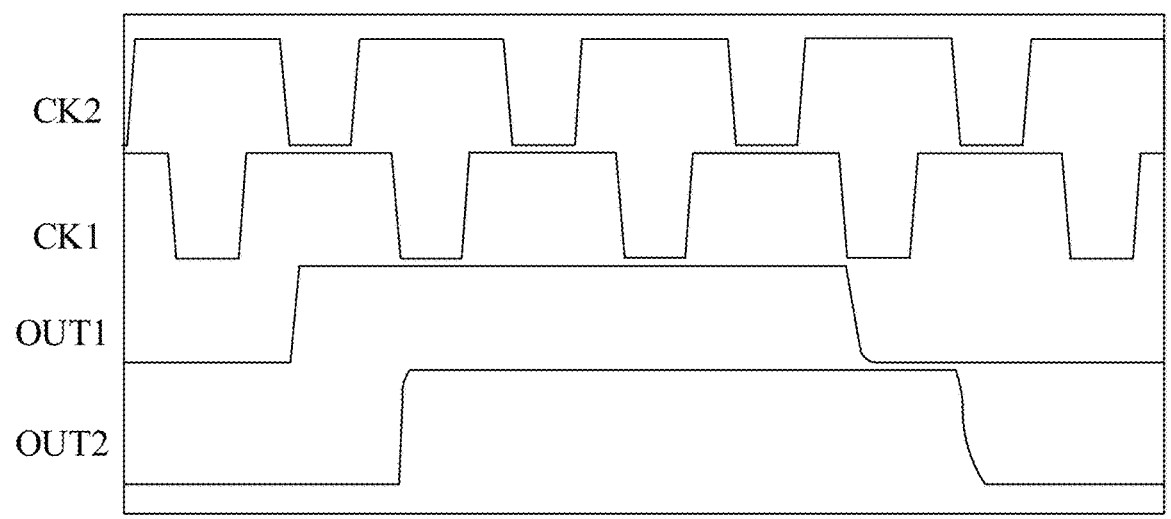
FIG. 15 is a timing diagram of signal terminals coupled to a shift register unit according to some embodiments of the present disclosure.
Figure 16:
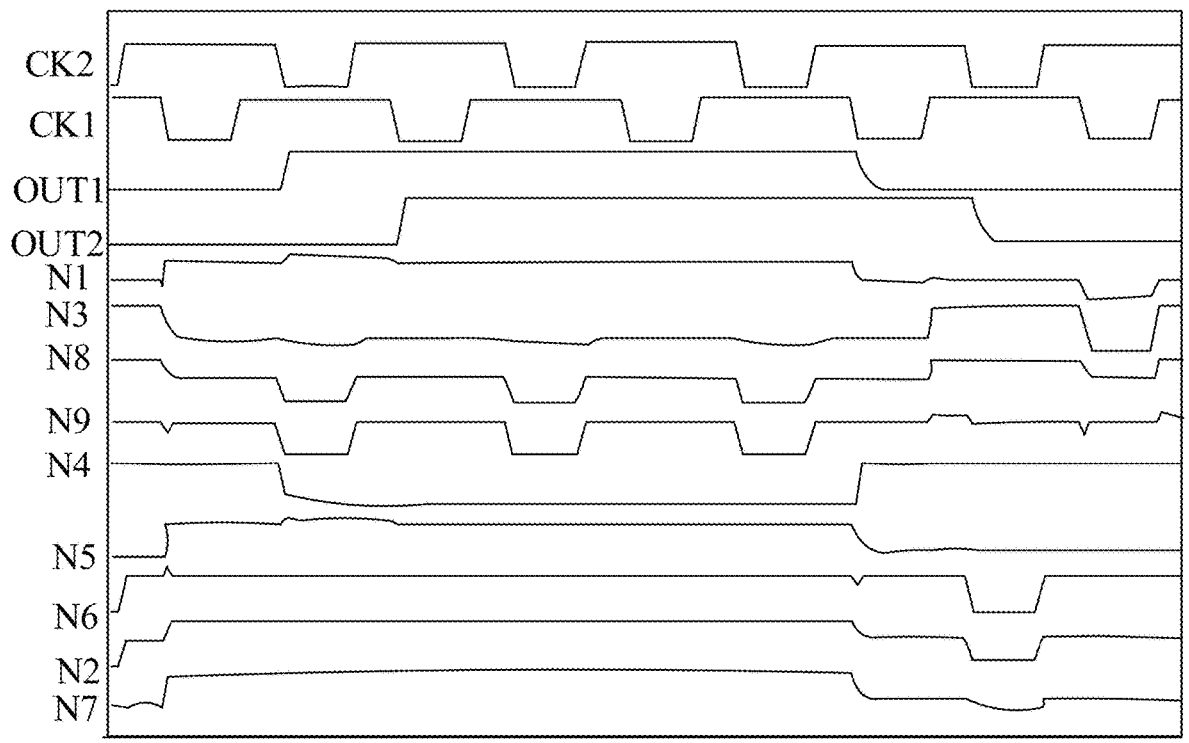
FIG. 16 is a timing diagram of signal terminals coupled to another shift register unit according to some embodiments of the present disclosure.

As can be seen from the timing simulation diagrams shown in FIG. 15 and FIG. 16, in the embodiments of the present disclosure, in the same time period, the potential of the first clock signal provided by the first clock terminal CK1 and the potential of the second clock signal provided by the second clock terminal CK2 are opposite. In addition, in one cycle, the duration during which the first clock signal and the second clock signal each are at the first potential is shorter than the duration during which the first clock signal and the second clock signal each are at the second potential. Therefore, it can be known that the time period during which one of the first clock signal and the second clock signal is at the first potential is within the time period during which the other clock signal is at the second potential. The second potential of the input signal provided by the input terminal IN corresponds to the potential of the second power signal, and the first potential of the input signal corresponds to the potential of the first power signal. Meanwhile, the low potential at the fifth node N5 may be similarly considered as a value obtained by adding the absolute value of the threshold voltage of the twelfth transistor T12 to the potential of the first power signal. However, because the threshold voltage of the twelfth transistor T12 is very small compared with the potential of the first power signal, it can be assumed that the low potential at the fifth node N5, the potential of the first power signal, and the low potential of the input signal are substantially the same or similar to each other, thereby avoiding the output step phenomenon.

The input terminal IN provides an input signal at the high potential, the potential of the first clock signal is the low potential, and the potential of the second clock signal is the high potential. Further, the first transistor T1, the fourth transistor T4 and the fifth transistor T5 are turned on, and the tenth transistor T10 is turned off. Accordingly, the input signal at the high potential is transmitted to the first node N1 through the first transistor T1, and transmitted to the seventh node N7 through the fifth transistor T5. Since the twelfth transistor T12 and the eighth transistor T8 are normally turned on the input signal at the high potential transmitted to the first node N1 is further transmitted to the fifth node N5 through the twelfth transistor T12, and the input signal at the high potential transmitted to the seventh node N7 is further transmitted to the second node N2 through the eighth transistor T8. Further, the second transistor T2, the third transistor T3, the seventh transistor T7 and the eleventh transistor T11 are all turned off. In addition, the first power signal at the low potential is transmitted to the third node N3 through the fourth transistor T4. Since the sixteenth transistor T16 is normally turned on the first power signal at the low potential transmitted to the third node N3 is further transmitted to the eighth node N8 through the sixteenth transistor T16, the ninth transistor T9 and the sixth transistor T6 are turned on, and the second power signal at the high potential is transmitted to the seventh node N7 through the sixth transistor T6, thereby ensuring that the potential at the second node N2 is the high potential. Then, the potential of the second clock signal jumps to the low potential, and the potential of the first clock signal jumps to the high potential. On this basis, the tenth transistor T10 is turned on, and the second clock signal at the low potential is transmitted to the fourth node N4 through the tenth transistor T10. Further, the thirteenth transistor T13 is turned on, and the second power signal at the high potential is transmitted to the output terminal OUT through the thirteenth transistor T13 until the potential of the input signal jumps to the low potential.

When the potential of the input signal jumps to the low potential, the potential of the first clock signal is the low potential, and the potential of the second clock signal is the high potential, the first transistor T1, the fifth transistor T5 and the fourth transistor T4 are turned on, and the tenth transistor T10 is turned off. Accordingly, the input signal at the low potential is transmitted to the first node N1 through the first transistor T1, and then is transmitted to the fifth node N5 through the twelfth transistor T12 which is normally turned on, and the fourteenth transistor T14 is turned on. Further, the first power signal at the low potential is transmitted to the output terminal OUT through the fourteenth transistor T14. In addition, the input signal at the low potential is also transmitted to the second node N2 through the fifth transistor T5 and the eighth transistor T8 which is normally turned on the second transistor T2 and the seventh transistor T7 are turned on, and the second clock signal at the high potential is transmitted to the seventh node N7 through the seventh transistor T7, thereby adjusting the potential at the second node N2 to the high potential. The second transistor T2 is turned off, and thus the potential at the first node N1 is not affected. In addition, the eleventh transistor T11 is turned on, and the second power signal at the high potential is transmitted to the fourth node N4 through the eleventh transistor T11, to ensure that the thirteenth transistor T13 is reliably turned off. Furthermore, the third transistor T3 is turned on the first clock signal at the low potential is transmitted to the third node N3 through the third transistor T3, and the first power signal at the low potential is transmitted to the third node N3 through the fourth transistor T4, and the first clock signal and the first power signal are then transmitted to the eighth node N8 through the sixteenth transistor T16 which is normally turned on, and the ninth transistor T9) is turned on. However, since the tenth transistor T10 is turned off, the potential at the fourth node N4 is not affected.

It should be noted that FIG. 15 and FIG. 16 do not show the potential of the input signal, but show the simulation schematic diagram of the first clock signal provided by the first clock terminal CK1, the second clock signal provided by the second clock terminal CK2, and the signals output from the output terminals OUT of adjacent two stages of shift register units. In addition, FIG. 16 also shows a simulation schematic diagram of the potential at each node in the shift register unit. Here, the ninth node N9 is a node coupled between the ninth transistor T9 and the tenth transistor T10. The abscissa refers to time, in unit of minute (m); and the ordinate refers to voltage, in unit of volt (V). The abscissa and ordinate are not shown in the figure. As can be seen from FIG. 15 and FIG. 16, in the embodiments of the present disclosure, no step occurs in the process that the signal output from the output terminal OUT of the shift register unit jumps from the high potential to the low potential, that is, no smearing phenomenon occurs, and the shift register unit has good output stability.

In summary, the embodiments of the present disclosure provide a shift register unit, including two input circuits, two control circuits and one output circuit. The input circuits can control the potential at the first node and the potential at the third node based on the clock signal provided by the coupled clock terminal, the power signal provided by the power terminal, and the potential at the second node. The control circuits can control the potential at the fourth node and the potential at the fifth node based on the clock signal provided by the coupled clock terminal, the power signal provided by the power terminal, and the potentials at the first node, the second node and the third node. The output circuit can transmit the first power signal or the second power signal to the output terminal based on the potential at the fourth node and the potential at the fifth node. In this way, the signal provided by each signal terminal can be flexibly set such that the signal at the required potential is reliably transmitted to the fourth node and the fifth node. Thus, the output circuit is fully and quickly turned on or off, thereby preventing steps from appearing when the potential of the signal transmitted to the output terminal jumps, that is, preventing signal smearing of the output signal and ensuring the good output stability.

Figure 17:
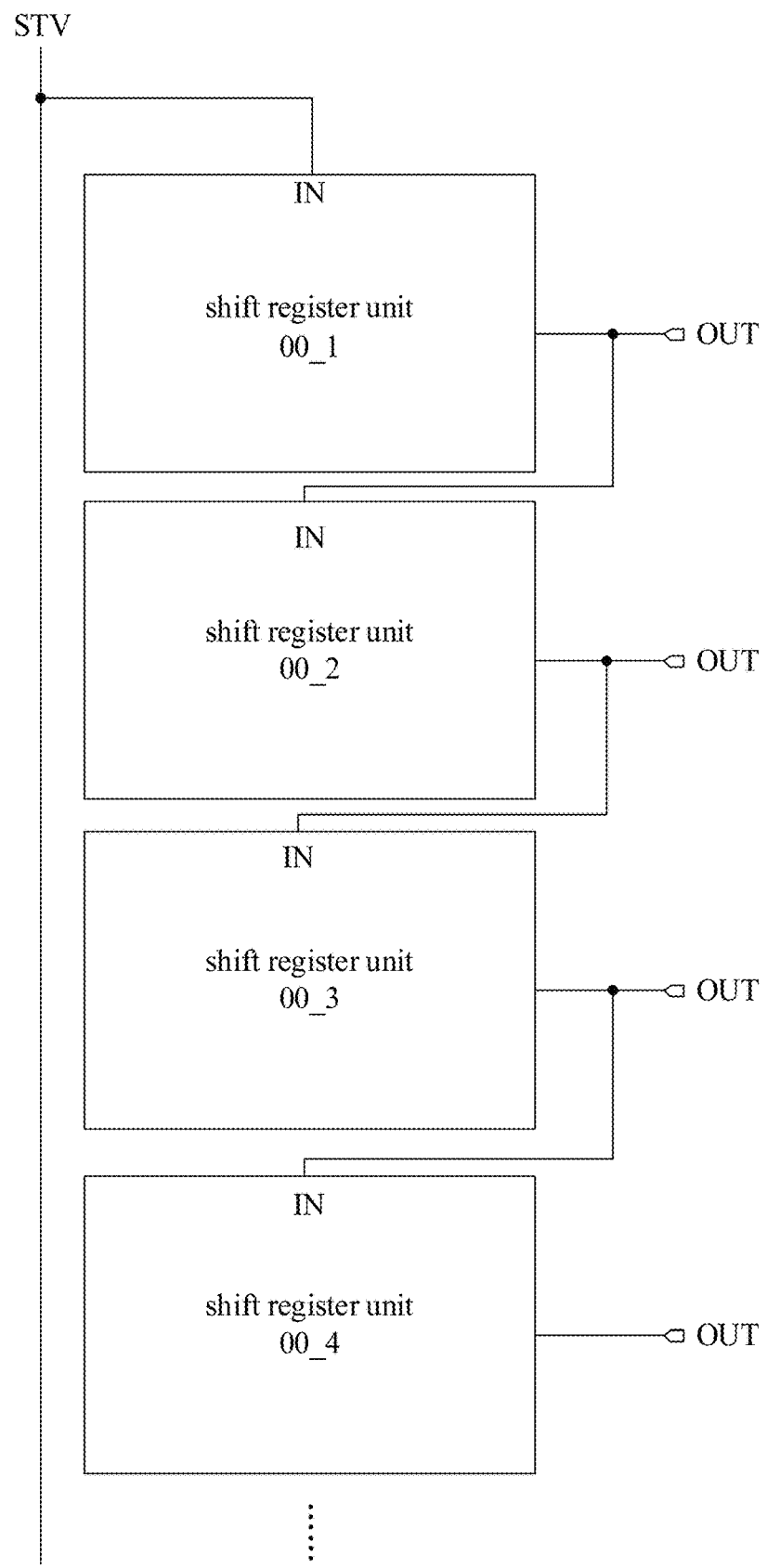
FIG. 17 is a schematic structural diagram of a gate driver circuit according to some embodiments of the present disclosure.

FIG. 17 is a schematic structural diagram of a gate driver circuit according to some embodiments of the present disclosure. As shown in FIG. 17, the gate driver circuit includes at least two cascaded shift register units 00 as shown in any one of FIG. 1 to FIG. 14.

The input terminal IN of the first stage of shift register unit 00 is coupled to an input enable terminal STV. In other stages of shift register units 00 other than the first stage of shift register unit 00, the input terminal IN of each stage of shift register unit 00 is coupled to the output terminal OUT of the cascaded previous stage of shift register unit 00.

Figure 18:
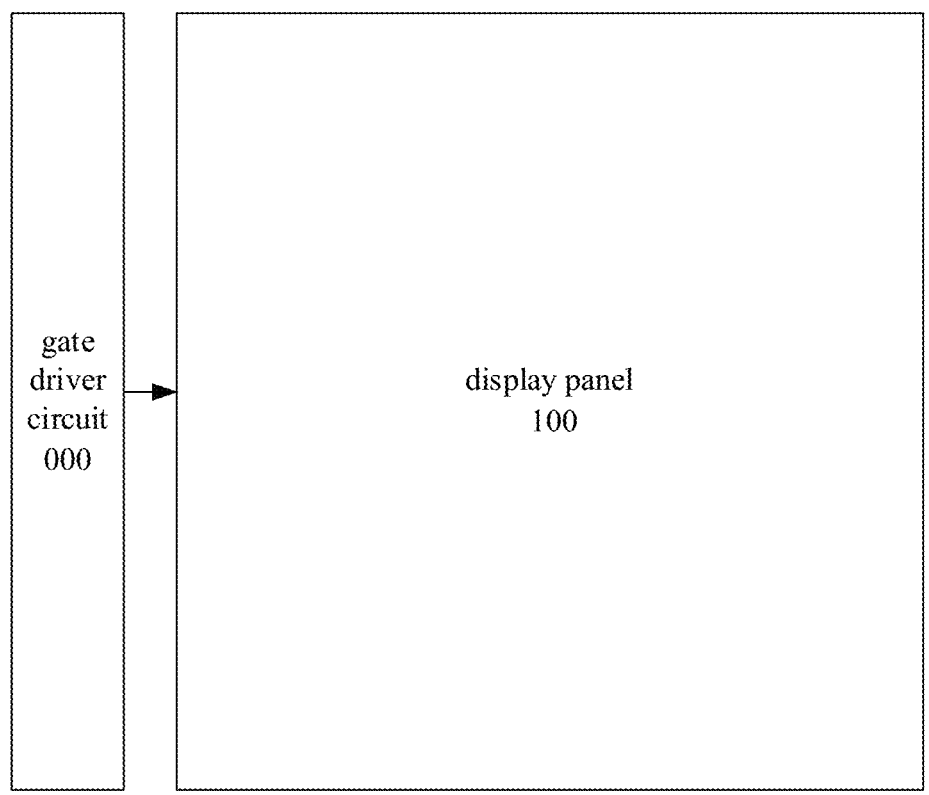
FIG. 18 is a schematic structural diagram of a display device according to some embodiments of the present disclosure.

FIG. 18 is a schematic structural diagram of a display device according to some embodiments of the present disclosure. As shown in FIG. 18, the display device includes a display panel 100 and the gate driver circuit 000 as shown in FIG. 17.

The display panel 100 includes a plurality of pixels (not shown in the figure). The gate driver circuit 000 is coupled to the plurality of pixels, and is configured to transmit gate driving signals to the plurality of pixels.

Optionally, as described in the foregoing embodiments, the pixel includes a plurality of transistors, and the plurality of transistors are all N-type oxide transistors.

Optionally, the display device may be any product or component having a display function such as an AMOLED display device, an electronic paper, a mobile phone, a tablet computer, a television, a display, a notebook computer or a navigator.

It should be understood that the terms used in the embodiments of the present disclosure are merely only used to explain the embodiments of the present disclosure, and are not intended to limit the present disclosure. Unless otherwise defined, the technical terms or scientific terms used in embodiments of the present disclosure shall have the ordinary meaning understood by those of ordinary skill in the art to which the present disclosure belongs.

For example, "first," "second," or "third," and similar terms used in the description and claims of the present disclosure do not denote any order, quantity, or importance, but are merely used to distinguish different components.

Similarly, "a", "an" or the like does not denote any quantity limit, but indicates the presence of at least one.

"Comprise", "include" or the like means that the element or object appearing before "comprise" or "include" encompasses elements or objects appearing after "comprise" or "include" and equivalents thereof, without excluding other elements or objects.

"On," "under," "left" or "right" is merely used to indicate the relative positional relationship, and when the absolute position of a described object changes, the relative positional relationship may also change accordingly. "Connected" or "coupled" means an electrical connection.

"And/or" represents three relationships. For example, A and/or B represents: A exists alone, A and B exist concurrently, and B exists alone. The character "/" generally indicates an "or" relationship between associated objects.

It should be clearly understood by those skilled in the art that, for the convenience and brevity of description, for the specific working processes of the gate driver circuit, the shift register unit, the circuits and the sub-circuits described above, reference may be made to the corresponding processes in the method embodiments, and details are not described herein again The above descriptions are merely optional embodiments of the present disclosure, and are not intended to limit the present disclosure. Any variations, equivalent substitutions, improvements and the like made within the spirit and principles of the present disclosure shall be included within the protection scope of the present disclosure.

What is claimed is:

1. A shift register unit, comprising:
a first input circuit, coupled to a first clock terminal, an input terminal, a first node and a second node, and configured to control connection or disconnection between the input terminal and the first node in response to a first clock signal provided by the first clock terminal, and control connection or disconnection between the second node and the first node in response to a potential at the second node;
a second input circuit, coupled to the first node, the first clock terminal, a first power terminal and a third node, and configured to control connection or disconnection between the first clock terminal and the third node in response to a potential at the first node, and control connection or disconnection between the first power terminal and the third node in response to the first clock signal;
a first control circuit, coupled to the input terminal, the first clock terminal, the second node, a second power terminal, a second clock terminal and the third node, and configured to control connection or disconnection between the input terminal and the second node in response to the first clock signal, control connection or disconnection between the second power terminal and the second node in response to a potential at the third node, and control connection or disconnection between the second clock terminal and the second node in response to the potential at the second node;

a second control circuit, coupled to the third node, the second clock terminal, the first node, the first power terminal, the second power terminal, a fourth node and a fifth node, and configured to control connection or disconnection between the second clock terminal and the fourth node in response to the potential at the third node and a second clock signal provided by the second clock terminal, control connection or disconnection between the second power terminal and the fourth node in response to the potential at the first node, and control the first node to be connected to the fifth node in response to a first power signal provided by the first power terminal; and an output circuit, coupled to the fourth node, the fifth node, the first power terminal, the second power terminal and an output terminal, and configured to control connection or disconnection between the second power terminal and the output terminal in response to a potential at the fourth node, and control connection or disconnection between the first power terminal and the output terminal in response to a potential at the fifth node.

2. The shift register unit according to claim 1, wherein the first input circuit comprises: a first input sub-circuit and a second input sub-circuit; wherein the first input sub-circuit is coupled to the first clock terminal, the input terminal and the first node, and is configured to control the connection or disconnection between the input terminal and the first node in response to the first clock signal provided by the first clock terminal; and the second input sub-circuit is coupled to the second node and the first node, and is configured to control the connection or disconnection between the second node and the first node in response to the potential at the second node.

3. The shift register unit according to claim 2, wherein the first input sub-circuit comprises a first transistor; and the second input sub-circuit comprises a second transistor; wherein a gate of the first transistor is coupled to the first clock terminal, a first electrode of the first transistor is coupled to the input terminal, and a second electrode of the first transistor is coupled to the first node; and a gate and a first electrode of the second transistor are both coupled to the second node, and a second electrode of the second transistor is coupled to the first node.

4. The shift register unit according to claim 1, wherein the second input circuit comprises: a third input sub-circuit and a fourth input sub-circuit; wherein the third input sub-circuit is coupled to the first node, the first clock terminal and the third node, and is configured to control the connection or disconnection between the first clock terminal and the third node in response to the potential at the first node; and the fourth input sub-circuit is coupled to the first clock terminal, the first power terminal and the third node, and is configured to control the connection or disconnection between the first power terminal and the third node in response to the first clock signal.

5. The shift register unit according to claim 1, wherein the first control circuit comprises:

a first control sub-circuit, coupled to the first clock terminal, the input terminal and the second node, and configured to control the connection or disconnection between the input terminal and the second node in response to the first clock signal;

a second control sub-circuit, coupled to the second node, the second power terminal, the third node, the second clock terminal and a sixth node, and configured to control connection or disconnection between the second power terminal and the sixth node in response to the potential at the third node, and control connection or disconnection between the second clock terminal and the sixth node in response to the potential at the second node; and a potential adjustment sub-circuit, coupled to the second node and the sixth node, and configured to adjust the potential at the second node and a potential at the sixth node.

6. The shift register unit according to claim 1, wherein the second control circuit comprises:

a third control sub-circuit, coupled to the third node, the second clock terminal, the second power terminal, the first node and the fourth node, and configured to control the connection or disconnection between the second clock terminal and the fourth node in response to the potential at the third node and the second clock signal, and control the connection or disconnection between the second power terminal and the fourth node in response to the potential at the first node; and a fourth control sub-circuit, coupled to the first power terminal, the first node and the fifth node, and configured to control the first node to be connected to the fifth node in response to the first power signal.

7. The shift register unit according to claim 6, wherein the third control sub-circuit comprises a ninth transistor, a tenth transistor, an eleventh transistor and a second capacitor; and the fourth control sub-circuit comprises a twelfth transistor; wherein a gate of the ninth transistor is coupled to the third node, a first electrode of the ninth transistor and a gate of the tenth transistor are both coupled to the second clock terminal, a second electrode of the ninth transistor is coupled to a first electrode of the tenth transistor, and a second electrode of the tenth transistor is coupled to the fourth node;

a gate of the eleventh transistor is coupled to the first node, a first electrode of the eleventh transistor is coupled to the second power terminal, and a second electrode of the eleventh transistor is coupled to the fourth node;

a first terminal of the second capacitor is coupled to the gate of the ninth transistor, and a second terminal of the second capacitor is coupled to the second electrode of the ninth transistor; and a gate of the twelfth transistor is coupled to the first power terminal, a first electrode of the twelfth transistor is coupled to the first node, and a second electrode of the twelfth transistor is coupled to the fifth node.

8. The shift register unit according to claim 1, wherein the output circuit comprises: a first output sub-circuit and a second output sub-circuit; wherein the first output sub-circuit is coupled to the fourth node, the second power terminal and the output terminal, and is configured to control the connection or disconnection between the second power terminal and the output terminal in response to the potential at the fourth node; and the second output sub-circuit is coupled to the fifth node, the first power terminal and the output terminal, and is configured to control the connection or disconnection between the first power terminal and the output terminal in response to the potential at the fifth node.

9. The shift register unit according to claim 1, further comprising: a fourth control circuit; wherein the fourth control circuit is coupled to a discharge control terminal, the second power terminal and the first node, and is configured to control connection or disconnection between the second power terminal and the first node in response to a discharge control signal provided by the discharge control terminal.

10. The shift register unit according to claim 9, wherein the fourth control circuit comprises: a fifteenth transistor; wherein a gate of the fifteenth transistor is coupled to the discharge control terminal, a first electrode of the fifteenth transistor is coupled to the second power terminal, and a second electrode of the fifteenth transistor is coupled to the first node.

11. The shift register unit according to claim 1, further comprising:

a fifth control circuit, coupled to the first power terminal, the third node and an eighth node, and configured to control the third node to be connected to the eighth node in response to the first power signal;

wherein the eighth node is coupled to the second input circuit, or the eighth node is coupled to the second control circuit.

12. The shift register unit according to claim 11, wherein the fifth control circuit comprises: a sixteenth transistor; wherein a gate of the sixteenth transistor is coupled to the first power terminal, a first electrode of the sixteenth transistor is coupled to the eighth node, and a second electrode of the sixteenth transistor is coupled to the third node.

13. A shift register unit, comprising:

a first input transistor, wherein a gate of the first input transistor is coupled to a first clock terminal, a first electrode of the first input transistor is coupled to an input terminal, and a second electrode of the first input transistor is coupled to a first node, and the first input transistor is configured to control connection or disconnection between the input terminal and the first node in response to a first clock signal provided by the first clock terminal;

a second input transistor, wherein a gate and a first electrode of the second input transistor are coupled to a second node, and a second electrode of the second input transistor is coupled to the first node, and the second input transistor is configured to control connection or disconnection between the second node and the first node in response to a potential at the second node;

a second input circuit, coupled to the first node, the first clock terminal and a third node, and configured to control connection or disconnection between the first clock terminal and the third node in response to a potential at the first node;

a first control circuit, coupled to the input terminal, the first clock terminal and the second node, and configured to control connection or disconnection between the input terminal and the second node in response to the first clock signal;

a second control circuit, coupled to the third node, a second clock terminal, the first node, a first power terminal, a fourth node and a fifth node, and configured to control connection or disconnection between the second clock terminal and the fourth node in response to a potential at the third node and a second clock signal provided by the second clock terminal, and control the first node to be connected to the fifth node in response to a first power signal provided by the first power terminal; and an output circuit, coupled to the fourth node, the fifth node, the first power terminal, a second power terminal and an output terminal, and configured to control connection or disconnection between the second power terminal and the output terminal in response to a potential at the fourth node, and control connection or disconnection between the first power terminal and the output terminal in response to a potential at the fifth node.

14. The shift register unit according to claim 13, wherein the second input circuit is further coupled to the first power terminal, and is configured to control connection or disconnection between the first power terminal and the third node in response to the first clock signal;

the second input circuit comprises a third transistor and a fourth transistor; wherein a gate of the third transistor is coupled to the first node, a first electrode of the third transistor is coupled to the first clock terminal, and a second electrode of the third transistor is coupled to the third node; and a gate of the fourth transistor is coupled to the first clock terminal, a first electrode of the fourth transistor is coupled to the first power terminal, and a second electrode of the fourth transistor is coupled to the third node.

15. The shift register unit according to claim 13, wherein the first control circuit is further coupled to the second power terminal, the second clock terminal and the third node, and is configured to control connection or disconnection between the second power terminal and the second node in response to the potential at the third node, and control connection or disconnection between the second clock terminal and the second node in response to the potential at the second node;

the first control circuit comprises a fifth transistor, a sixth transistor, a seventh transistor, and a first capacitor; wherein a gate of the fifth transistor is coupled to the first clock terminal, a first electrode of the fifth transistor is coupled to the input terminal, and a second electrode of the fifth transistor is coupled to the second node;

a gate of the sixth transistor is coupled to the third node, a first electrode of the sixth transistor is coupled to the second power terminal, and a second electrode of the sixth transistor is coupled to a second electrode of the seventh transistor;

a gate of the seventh transistor is coupled to the second node, and a first electrode of the seventh transistor is coupled to the second clock terminal; and a first terminal of the first capacitor is coupled to the second node, and a second terminal of the first capacitor is coupled to the second electrode of the seventh transistor.

16. The shift register unit according to claim 13, wherein the second control circuit is further coupled to the second power terminal, and is configured to control connection or disconnection between the second power terminal and the fourth node in response to the potential at the first node;

the second control circuit comprises a ninth transistor, a tenth transistor, an eleventh transistor, a twelfth transistor, and a second capacitor; wherein a gate of the ninth transistor is coupled to the third node, a first electrode of the ninth transistor and a gate of the tenth transistor are both coupled to the second clock terminal, a second electrode of the ninth transistor is coupled to a first electrode of the tenth transistor, and a second electrode of the tenth transistor is coupled to the fourth node;

a gate of the eleventh transistor is coupled to the first node, a first electrode of the eleventh transistor is coupled to the second power terminal, and a second electrode of the eleventh transistor is coupled to the fourth node;

a first terminal of the second capacitor is coupled to the gate of the ninth transistor, and a second terminal of the second capacitor is coupled to the second electrode of the ninth transistor; and a gate of the twelfth transistor is coupled to the first power terminal, a first electrode of the twelfth transistor is coupled to the first node, and a second electrode of the twelfth transistor is coupled to the fifth node.

17. The shift register unit according to claim 13, wherein the output circuit comprises: a thirteenth transistor, a fourteenth transistor, and a third capacitor; wherein a gate of the thirteenth transistor is coupled to the fourth node, a first electrode of the thirteenth transistor is coupled to the second power terminal, and a second electrode of the thirteenth transistor is coupled to the output terminal;

a first terminal of the third capacitor is coupled to the gate of the thirteenth transistor, and a second terminal of the third capacitor is coupled to the first electrode of the thirteenth transistor; and a gate of the fourteenth transistor is coupled to the fifth node, a first electrode of the fourteenth transistor is coupled to the first power terminal, and a second electrode of the fourteenth transistor is coupled to the output terminal.

18. A gate driver circuit, comprising: at least two cascaded shift register units according to claim 13; wherein an input terminal of a first stage of shift register unit is coupled to an input enable terminal, and in other stages of shift register units other than the first stage of shift register unit, an input terminal of each stage of shift register unit is coupled to an output terminal of a cascaded previous stage of shift register unit.

19. A gate driver circuit, comprising: at least two cascaded shift register units; wherein each of the at least two cascaded shift register units comprises:

a first input circuit, coupled to a first clock terminal, an input terminal, a first node and a second node, and configured to control connection or disconnection between the input terminal and the first node in response to a first clock signal provided by the first clock terminal, and control connection or disconnection between the second node and the first node in response to a potential at the second node;

a second input circuit, coupled to the first node, the first clock terminal, a first power terminal and a third node, and configured to control connection or disconnection between the first clock terminal and the third node in response to a potential at the first node, and control connection or disconnection between the first power terminal and the third node in response to the first clock signal;

a first control circuit, coupled to the input terminal, the first clock terminal, the second node, a second power terminal, a second clock terminal and the third node, and configured to control connection or disconnection between the input terminal and the second node in response to the first clock signal, control connection or disconnection between the second power terminal and the second node in response to a potential at the third node, and control connection or disconnection between the second clock terminal and the second node in response to the potential at the second node;

a second control circuit, coupled to the third node, the second clock terminal, the first node, the first power terminal, the second power terminal, a fourth node and a fifth node, and configured to control connection or disconnection between the second clock terminal and the fourth node in response to the potential at the third node and a second clock signal provided by the second clock terminal, control connection or disconnection between the second power terminal and the fourth node in response to the potential at the first node, and control the first node to be connected to the fifth node in response to a first power signal provided by the first power terminal; and an output circuit, coupled to the fourth node, the fifth node, the first power terminal, the second power terminal and an output terminal, and configured to control connection or disconnection between the second power terminal and the output terminal in response to a potential at the fourth node, and control connection or disconnection between the first power terminal and the output terminal in response to a potential at the fifth node;

and an input terminal of a first stage of shift register unit is coupled to an input enable terminal, and in other stages of shift register units other than the first stage of shift register unit, an input terminal of each stage of shift register unit is coupled to an output terminal of a cascaded previous stage of shift register unit.

20. A display device, comprising: a display panel and the gate driver circuit according to claim 19; wherein the display panel comprises a plurality of pixels, and the gate driver circuit is coupled to the plurality of pixels and configured to transmit gate driving signals to the plurality of pixels.

* * * * *